(12) United States Patent
Hamada

(10) Patent No.: US 8,542,521 B2
(45) Date of Patent: Sep. 24, 2013

(54) SEMICONDUCTOR STORAGE DEVICE INCLUDING MEMORY CELLS CAPABLE OF HOLDING DATA

(75) Inventor: Makoto Hamada, San Jose, CA (US)

(73) Assignee: Kabushiki Kaisha Toshiba, Tokyo (JP)

(*) Notice: Subject to any disclaimer, the term of this patent is extended or adjusted under 35 U.S.C. 154(b) by 177 days.

(21) Appl. No.: 13/230,073

(22) Filed: Sep. 12, 2011

(65) Prior Publication Data
US 2013/0064000 A1    Mar. 14, 2013

(51) Int. Cl.
*G11C 11/00* (2006.01)
(52) U.S. Cl.
USPC .......................... 365/148; 365/236
(58) Field of Classification Search
USPC ................................... 365/148, 236
See application file for complete search history.

(56) References Cited

U.S. PATENT DOCUMENTS

| | | | |
|---|---|---|---|
| 5,473,178 A * | 12/1995 | Konishi | ................ 257/297 |
| 7,372,717 B2 | 5/2008 | Baker | |
| 7,495,964 B2 | 2/2009 | Taylor | |
| 7,577,044 B2 | 8/2009 | Baker | |

OTHER PUBLICATIONS

Giuseppe Di Cataldo, et al., "Double and Triple Charge Pump for Power IC: Dynamic Models Which Take Parasitic Effects in Account", IEEE Transactions on Circuits and Systems-I: Fundamental Theory and Applications, vol. 40, No. 2, Feb. 1993, pp. 92-101.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

According to one embodiment, a semiconductor storage device includes first cells, first bit and first word, and first sense. The first cells are capable of holding 2-level or higher-level data. The first bit and first word are capable of selecting the first cells. The first sense detects a first current. The first sense includes a first supply unit, a first accumulation unit, a detector, and a counter. The first supply unit supplies a second current when the data is read. The first accumulation unit accumulates an amount of charge. The detector detects the potential the amount of charge. The counter counts output from the detector. The counter includes a second supply unit, a second accumulation unit, and a sensing unit. The second supply unit charges a first node. The second accumulation unit accumulates a charge. The sensing unit detects the amount of charge of the second accumulation unit.

20 Claims, 14 Drawing Sheets

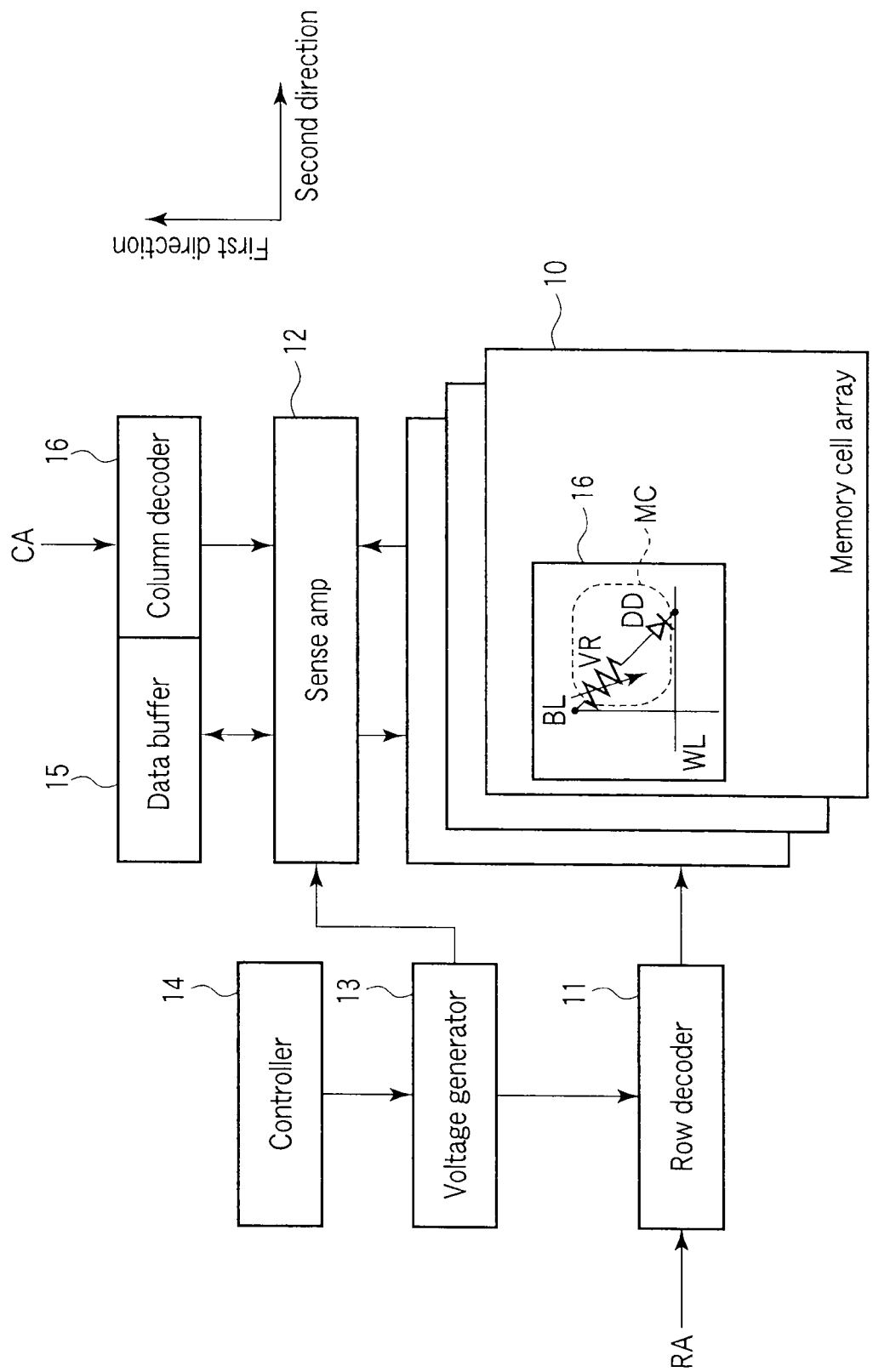
F I G. 1

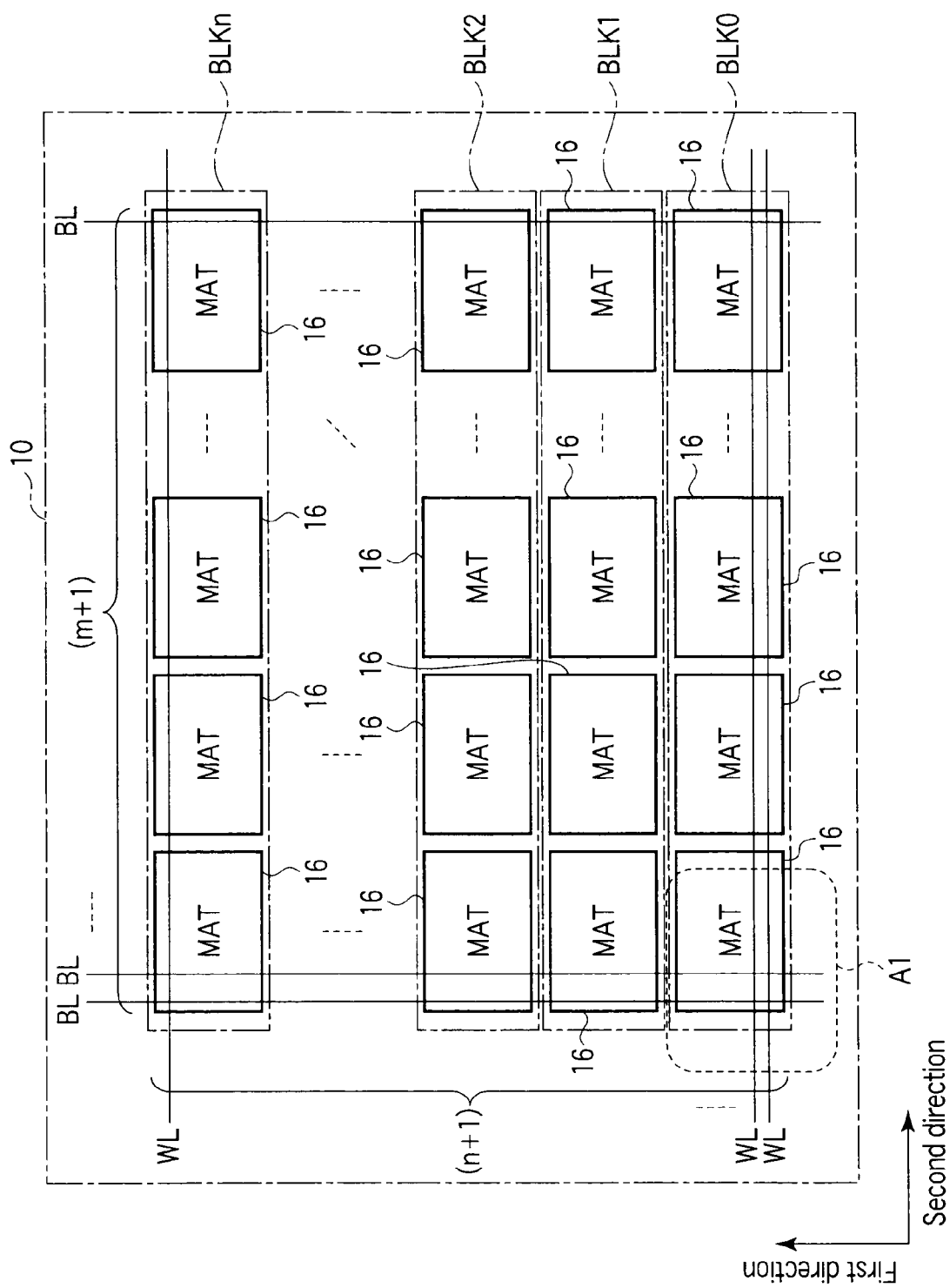
F I G. 2

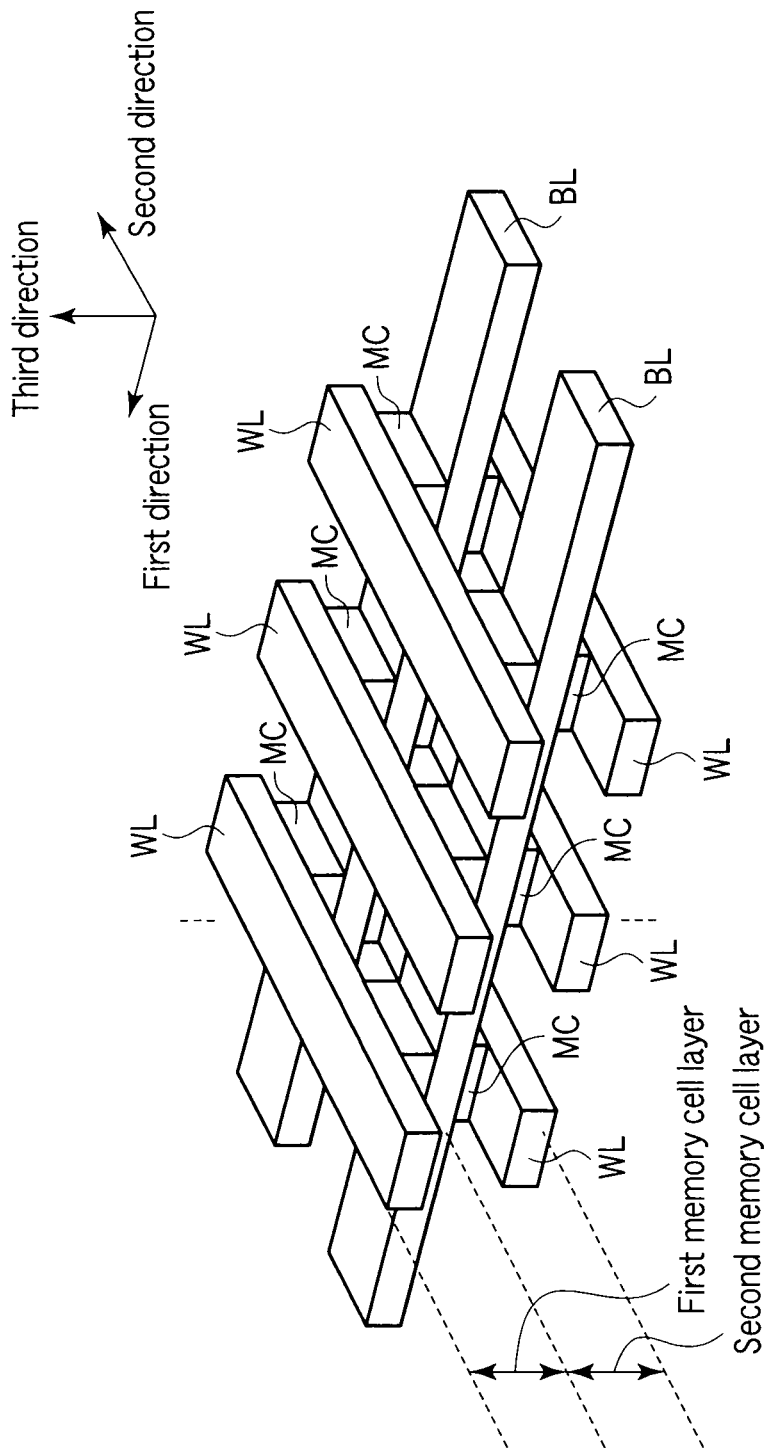
F I G. 3

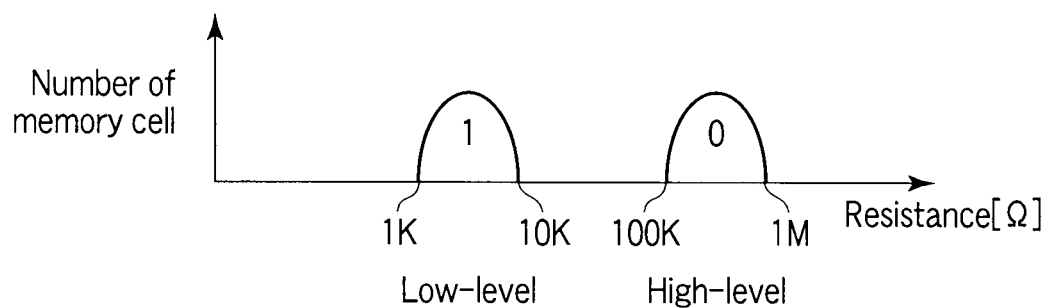
F I G. 4
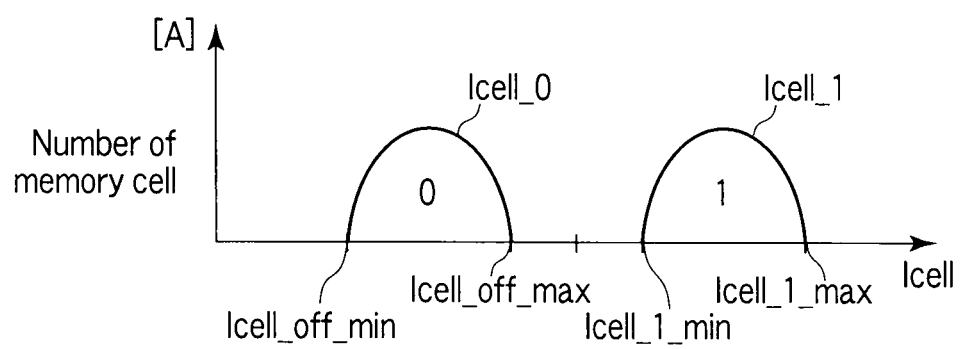
F I G. 5

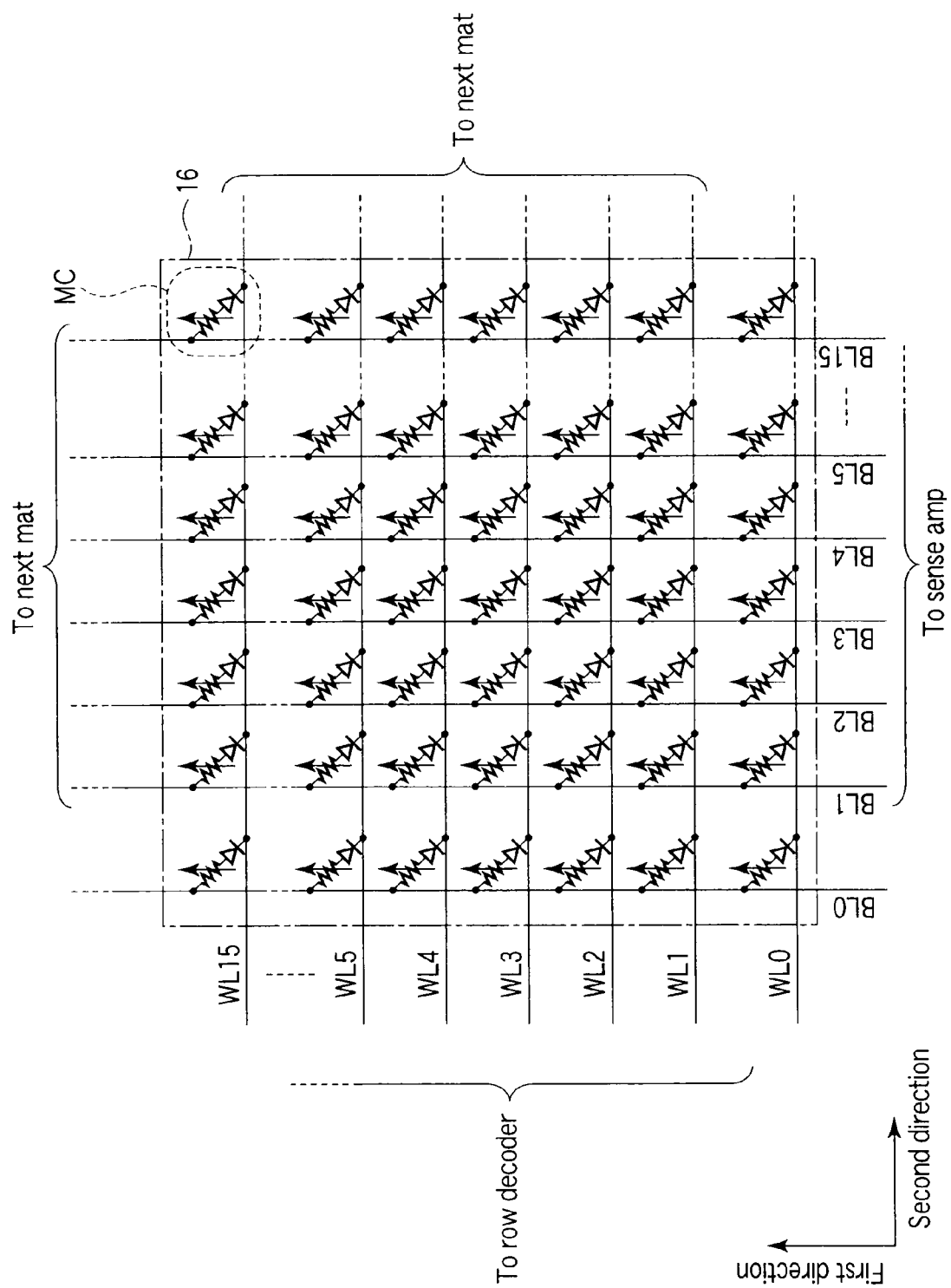
F I G. 6

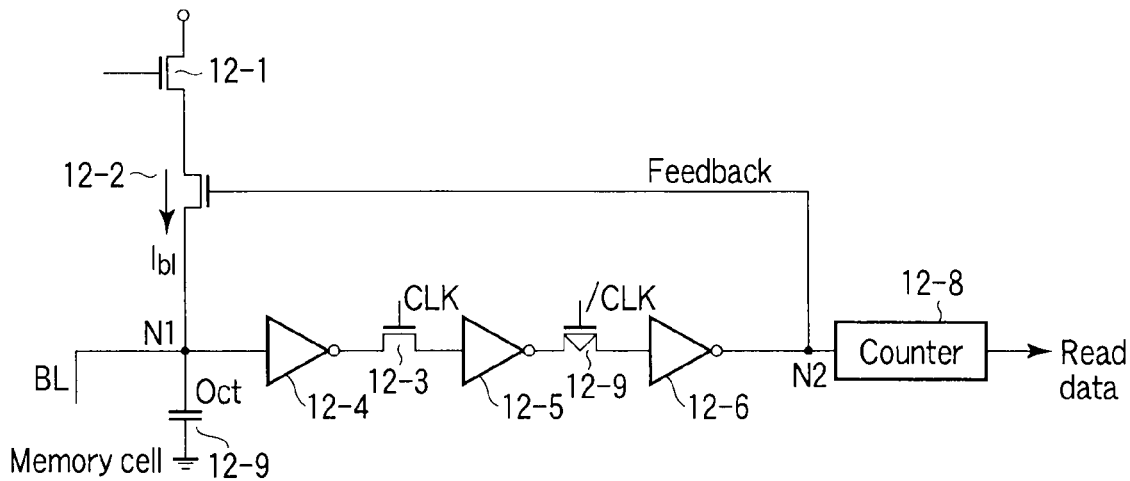
F I G. 7
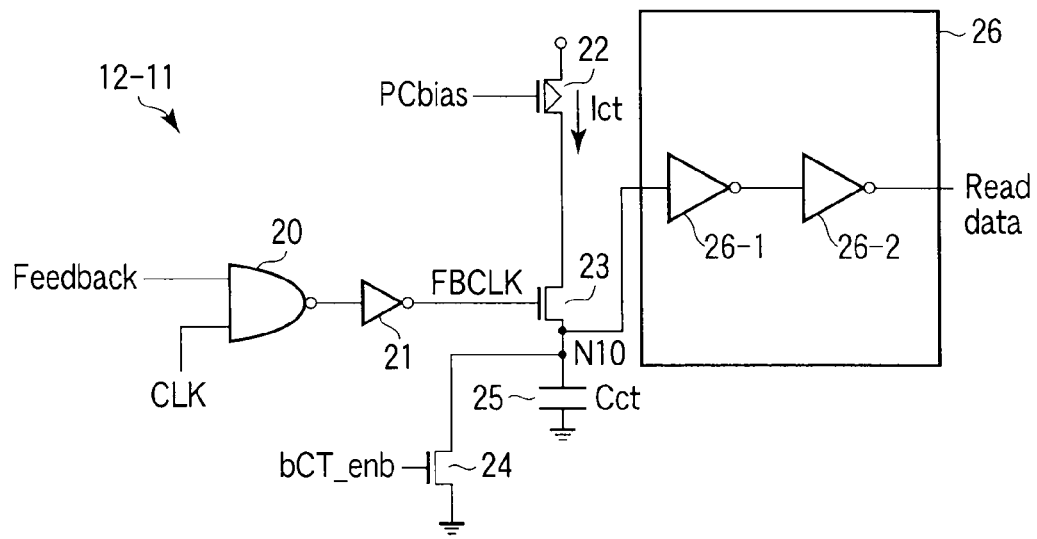
F I G. 8

SEMICONDUCTOR STORAGE DEVICE INCLUDING MEMORY CELLS CAPABLE OF HOLDING DATA

FIELD

Embodiments described herein relate generally to, for example, a semiconductor storage device using ReRAM as a memory cell.

BACKGROUND

In a sense amp using ΔΣmodulation, a current of a bit line is quantized when data is read, the quantized value is counted, and data to be held by a memory cell is recognized. When the data is read, a counter uses a digital counter to read the data.

Thus, an enormous region is occupied by a circuit area of the counter in the sense amp. The circuit area of the digital counter becomes enormous as the memory cell holds multi-level data.

BRIEF DESCRIPTION OF THE DRAWINGS

FIG. 1 is an overall block diagram of a semiconductor storage device according to a first embodiment;

FIG. 2 is a block diagram exemplifying a memory cell array according to the first embodiment;

FIG. 3 is a perspective view exemplifying the memory cell array according to the first embodiment;

FIG. 4 is a conceptual diagram showing a threshold distribution of memory cells according to the first embodiment;

FIG. 5 is a conceptual diagram showing a current flowing to the memory cell according to the first embodiment;

FIG. 6 is a circuit diagram exemplifying the memory cell array according to the first embodiment;

FIG. 7 is a block diagram exemplifying a sense amp according to the first embodiment;

FIG. 8 is a block diagram exemplifying a counter according to the first embodiment;

DETAILED DESCRIPTION

Figure 9:
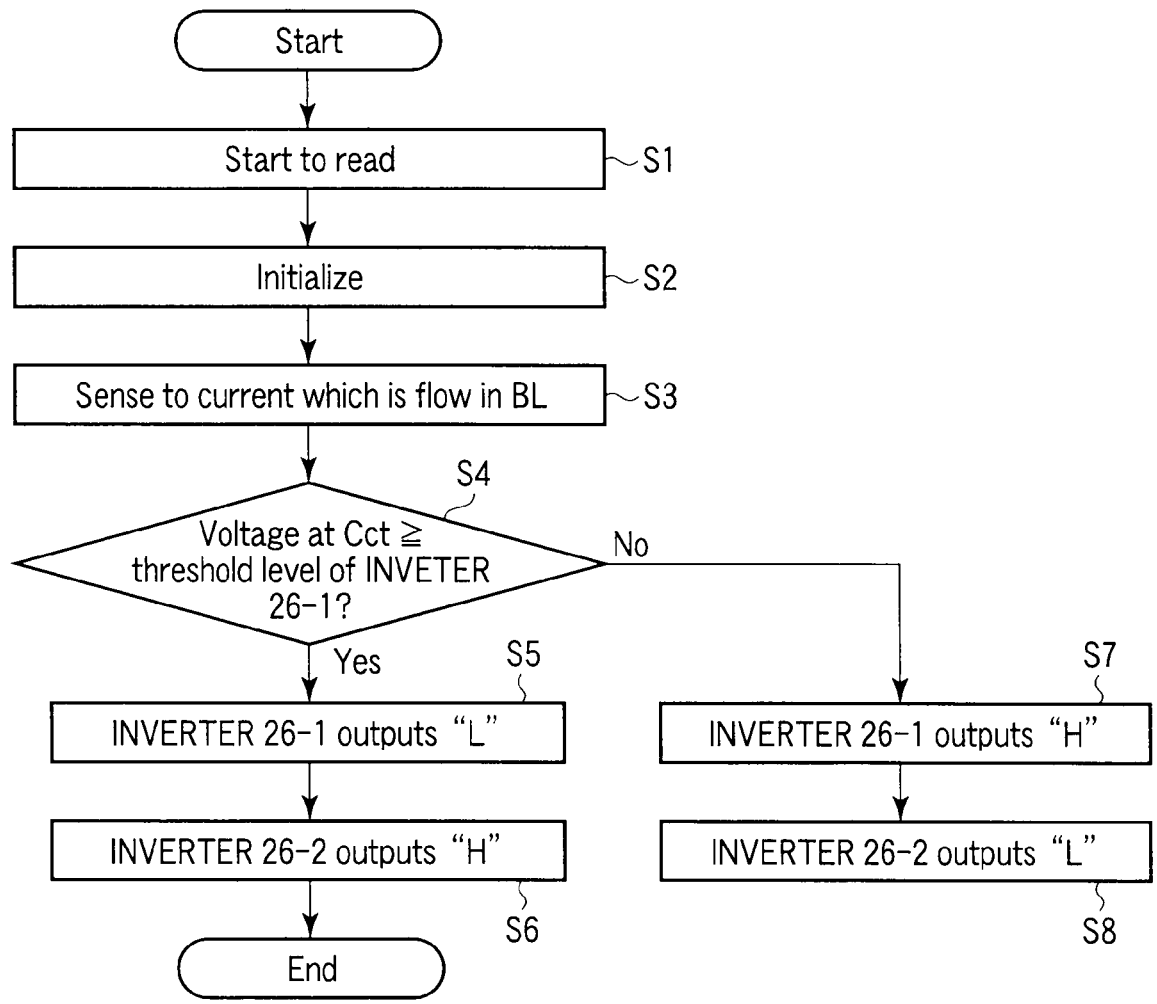
FIG. 9 is a flow chart showing a read operation of the semiconductor storage device according to the first embodiment.

The embodiments will be described below with reference to the drawings. In the description, common reference numerals are given to common elements throughout the drawings.

In general, according to one embodiment, a semiconductor storage device includes first memory cells, first bit lines and first word lines, and first sense amps. The first memory cells are capable of holding 2-level or higher-level data. The first bit lines and first word lines are capable of selecting the first memory cells and, formed in places where the first memory cells are provided by being crossed. The first sense amps detect a first current flowing to the first bit line in accordance with the data held by the first memory cell. The first sense amp includes a first supply unit, a first accumulation unit, a detector, and a counter. The first supply unit supplies a second current to the first bit line to compensate for the falling first current flowing to the first bit line when the data is read. The first accumulation unit accumulates an amount of charge in accordance with a potential of the first bit line. The detector detects the potential in accordance with the amount of charge of the first accumulation unit. The counter counts output from the detector. The counter includes a second supply unit, a second accumulation unit, and a sensing unit. The second supply unit charges a first node in accordance with the second current supplied to the first bit line. The second accumulation unit accumulates a charge in accordance with the potential of the first node. The sensing unit detects the amount of charge of the second accumulation unit to detect the data held by the first memory cell based on the amount of the charge.

First Embodiment

A semiconductor storage device according to the present embodiment has a function to ΔΣ-modulate the current of a bit line when data is read and includes a sense amp provided with an analog counter that counts a ΔΣ-modulated signal.

An overall configuration example of the semiconductor storage device according to the present embodiment will be described using FIG. 1. The present embodiment, in which a resistance random access memory (ReRAM) is used as a memory cell MC, will be described.

1. Overall Configuration Example

FIG. 1 is a block diagram of a semiconductor storage device using a ReRAM as the memory cell MC according to the present embodiment. As shown in FIG. 1, the semiconductor storage device according to the present embodiment includes a memory cell array 10, a row decoder 11, a sense amp 12, a voltage generator 13, a controller 14, and a data buffer 15.

The memory cell array 10 includes a plurality of bit lines BL provided along a first direction, a plurality of word lines WL provided along a second direction perpendicular to the first direction, and a plurality of memory cells MC provided at points of intersection of the bit lines BL and the word lines WL. A unit called a MAT 16 is constituted by an aggregate of the plurality of memory cells MC.

Each of the memory cells MC contains a rectifying device (diode) DD and a variable resistive element VR. A cathode of the diode DD is connected to the word line WL and an anode of the diode DD is connected to the bit line BL via the variable resistive element VR. Alternatively, the anode of the diode DD may be connected to the bit line BL and the cathode of the diode DD may be connected to the bit line BL via the variable resistive element VR. The variable resistive element VR has, for example, a structure in which a recording layer and a protective layer are successively stacked on the diode DD.

In the memory cell array 10, the plurality of memory cells MC arranged in the same row is connected to the same word line WL and the plurality of memory cells MC in the same column is connected to the same bit line BL. A plurality of units of the word line WL, the bit line BL, and the memory cell MC are provided along a third direction (direction perpendicular to a semiconductor substrate surface) perpendicular to both the first and second directions. That is, the memory cell array 10 has a structure in which the memory cells MC are three-dimensionally stacked. Each layer of memory cells in this three-dimensional structure may be called a memory cell layer below.

1-1. Details of a Configuration Example of the Memory Cell Array 10

Next, a detailed configuration example of the memory cell array 10 described above will be described using FIG. 2. FIG. 2 is a block diagram of the memory cell array 10 and shows only one memory cell layer.

As illustrated in FIG. 2, the memory cell array 10 according to the present embodiment includes (m+1)×(n+1) MATs 16 arranged like a matrix. m and n are each natural numbers equal to or greater than 1. As described above, each of the MATs 16 contains the plurality of memory cells MC, which are arranged like a matrix. For example, one MAT 16 contains 16 word lines WL and 16 bit lines BL. That is, one MAT 16 contains (16×16) memory cells MC. Moreover, the memory cell array 10 contains 16×(m+1) bit lines BL and 16×(n+1) word lines WL. A plurality of MATs 16 (that is, the MATs 16 sharing the word line WL) in the same row constitutes a block BLK. Thus, the memory cell block 10 is constituted of blocks BLK0 to BLKn. Hereinafter, when the blocks BLK0 to BLKn are not distinguished, the block is simply called the block BLK.

The present embodiment is described as a case when one memory cell layer includes the plurality of MATs 16, but the number of the MATs 16 may be 1. In addition, the number of memory cells MC contained in one MAT 16 is not limited to (16×16). Further, the row decoder 11 and the sense amp 12 may be provided for each MAT 16 or used by the plurality of MATs 16. Hereinafter, the latter case will be described.

1-2. Perspective View of the Memory Cell Array 10

FIG. 3 is a perspective view of a partial region of the memory cell array 10 and shows how the memory cell array 10 of the above configuration is three-dimensionally constituted. As illustrated in FIG. 3, the memory cell array 10 according to the present embodiment has a plurality of layers (a first memory cell layer, a second memory cell layer, . . . ) stacked in the direction perpendicular to the substrate surface of the semiconductor substrate (third direction). In the example in FIG. 3, the word line WL/the memory cell MC/the bit line BL/the memory cell MC/the word line WL/ . . . , are formed in this order, but the set of the word line WL/the memory cell MC/the bit line BL may be stacked via an interlayer dielectric.

1-3. Electric Characteristics of the Memory Cell MC

Next, characteristics of the memory cell MC will be described using FIG. 4. The memory cell MC holds 1-bit data of "0" or "1" in accordance with the value of resistance of the variable resistive element VR. The variable resistive element VR may take a low-resistance state in which the value of resistance is, for example, 1 kΩ to 10 kΩ and a high-resistance state in which the value of resistance is, for example, 100 kΩ to 1 MΩ.

The high-resistance state is the state holding the "0" data and the low-resistance state is the state holding the "1" data.

If a forward bias is applied to the memory cell MC in these states, the memory cell MC in the low-resistance state holding the "1" data has more current than the memory cell MC in the high-resistance state holding the "0" data.

This state will be described using FIG. 5. FIG. 5 shows a conceptual diagram of the current flowing to the memory cells MC in the low-resistance state and the high-resistance state. As shown in FIG. 5, the horizontal axis represents the current (Icell) and the vertical axis represents the number of memory cells MC. As shown in FIG. 5, a current Icell_1 flows to the memory cell MC in the low-resistance state (line A in FIG. 5) and a current Icell_0 (<the current Icell_1) flows to the memory cell MC in the high-resistance state (line B in FIG. 5). Hereinafter, when the current Icell_0 and the current Icell_1 are not distinguished, the current is simply called the current Icell.

The current (Icell) that flows to the memory cell MC when the memory cell MC holds one of the above threshold distributions will be described. FIG. 5 is a graph in which the horizontal axis represents the current (Icell) and the vertical axis represents the number of memory cell transistors MT.

As illustrated in FIG. 5, the current Icell_0 flows to the memory cell MC in the high-resistance state and the current Icell_1 flows to the memory cell MC in the low-resistance state. The current Icell_0 and the current Icell_1 are each distributed with a certain width. That is, there are variations of these currents. These variations result from variations of the resistance value of the memory cell MC and the like.

The minimum current value flowing to the memory cell MC in the high-resistance state is set to Icell_0_min and the maximum current value is set to Icell_0_max (>Icell_0_min). The minimum current value flowing to the memory cell MC in the low-resistance state is set as Icell_1_min and the maximum current value is set as Icell_1_max (>Icell_0_min). Thus, in the memory cell. MC, the value of current flowing to the memory cell MC changes in accordance with the high-resistance state and the low-resistance state and the relation Icell_1>Icell_0 is provided.

A case when the memory cell holds 2-level data is described here, but data that may be held by the memory cell MC is not limited; data such as 4-level and 8-level data may also be held. That is, if, for example, 4-level data is held, the memory cell MC also has 4-level resistance values and so four kinds of current in accordance with the resistance value of the memory cell MC flows multi-level data will be described in the third and fourth embodiments).

The high-resistance state and the low-resistance state may be controlled by the pulse width of the voltage applied to the variable resistive element VR when data is written, the voltage value, the rising speed of the voltage (rate of rise) and the like. More specifically, a transition to the low-resistance state is effected by making the pulse width of the voltage applied to the variable resistive element VR smaller, the voltage value smaller, and further the rising speed of the voltage slower (the rising angle smaller) than when the transition of the memory cell MC to the high-resistance state is caused. To cause a transition of the memory cell MC to the high-resistance state, at least one of the pulse width of the voltage, the voltage value, and the rising speed may be made larger than when a transition to the low-resistance state is caused. The state holding the "0" data is defined as the high-resistance state while the state holding the "1" data is defined as the low-resistance state in the above description, but the above definition may be reversed. That is, the low-resistance state may be a state holding the "0" data and the high-resistance state may be a state holding the "1" data.

1-4. Circuit Diagram of the Memory Cell MC

FIG. 6 is a circuit diagram of the memory cell array 10 and shows particularly a region corresponding to a region μl in FIG. 2 in one memory cell layer.

As illustrated in FIG. 6, the memory cell array 10 has the plurality of bit lines BL and the plurality of word lines WL formed therein by passing between the plurality of MATs 16.

The MAT 16 contains, as described above, 16 bit lines BL and 16 word lines WL. Further, as described above, there are the (m+1)×(n+1) MATs 16. That is, the word lines WL(16i) to WL(16i+15) are formed in a block BLKi. Each of the plurality of MATs 16 contained in a block BLK has the bit lines BL(16j) to BL(16j+15) formed therein, where i=0 to n and j=0 to m.

The memory cell MC is formed at each point of intersection of the bit line BL and the word line WL.

The word line WL is connected to the row decoder 11. On the other hand, the bit lines BL0 to BLn are connected to the sense amp 12.

1-5. Peripheral Circuit

Returning to FIG. 1, the row decoder 11 will be described. The row decoder 11 decodes a row address RA supplied from a host device when data is written or read. The row decoder 11 selects one of the word lines WL in accordance with a decode result of the row address RA. The row decoder 11 supplies appropriate voltages (voltages $V_{WL\_H}$ and $V_{WL\_L}$ described later) to the selected word line WL (hereinafter, referred to as the select word line WL) and other word lines WL (hereinafter, the non-select word lines WL). Incidentally, the relation of the voltages $V_{WL\_H} > V_{WL\_L}$ exists.

A column decoder 16 selects the bit line BL in accordance with a column address CA supplied from the host device.

The sense amp 12 is provided corresponding to the (m+1)×(n+1) MATs 16 and sense amps 12 as many as the number of the bit lines BL passing through one MAT 16 are provided. Each of the sense amps 12 is electrically connected to the bit line BL passing through each MAT 16. The sense amp 12 selects the bit line BL based on a decode result of the column decoder 16 when data is read and transfers appropriate voltages (voltages $V_{BL\_H}$ and $V_{BL\_L}$ described later) generated by the voltage generator 13. In this case, the sense amp 12 may read a piece of data one by one based on a decode result of the column decoder 16 or select all bit lines BL provided in one MAT 16 (hereinafter, the bit line BL to be read is called the select bit line BL and other bit lines BL as the non-select bit lines BL). More specifically, data is read from all bit lines BL passing through one selected MAT 16 by all sense amps 12. That is, one MAT 16 among the plurality of provided MATs 16 is selected as a selection unit when data is read. In other words, the plurality of MATs 16 is not selected in the present embodiment, but, as described above, data is read from one selected MAT 16 by a plurality of sense amps 12.

Further, for example, a plurality of sets of bit lines BL adjacent to each other in one MAT may be sensed simultaneously. When data is read, the sense amp 12 senses a current flowing to the select bit line BL.

The present embodiment will be described by focusing on when data is read. Here, the voltage (current) passed to the bit line BL when data is read has such a magnitude that the resistance value of the variable resistive element VR does not change. A detailed configuration of the sense amp 12 will be described later.

The sense amp 12, the row decoder 11, the data buffer 15, and the column decoder 16 may be provided for each memory cell layer or each MAT 16 or may be used in common among memory cell layers. Further, when the sense amp 12, the row decoder 11, the data buffer 15, and the column decoder 16 are used in common among memory cell layers, the allocation of the address of the memory cell MC may be changed/modified. Accordingly, even if a plurality of memory cell layers is stacked, an increase in size of peripheral circuits such as the sense amp 12, the row decoder 11, and the data buffer 15 may be inhibited.

The voltage generator 13 generates a reading voltage and in addition, for example, a write operation and a verify voltage according to the control of the controller 14. The voltage generator 13 supplies, for example, a reading voltage to the sense amp 12 and the row decoder 11. More specifically, the voltage generator 13 generates the voltage $V_{WL\_H}$, the voltage $V_{WL\_L}$, the voltage $V_{BL\_H}$, and the voltage $V_{BL\_L}$ and transfers these voltages to the select word line WL, the non-select word lines WL, the select bit line BL, and the non-select bit lines BL when data is read.

The relation of the voltages $V_{BL\_H} > V_{BL\_L}$ exists, the voltage $V_{BL\_H}$ is assumed to be a value larger than the voltage $V_{WL\_L}$, and the voltage $V_{BL\_L}$ is assumed to be a value smaller than the voltage $V_{WL\_H}$.

That is, when a reverse bias is applied to the diode DD, the voltage generator 13 transfers the voltage $V_{WL\_H}$ to the word line WL and the voltage $V_{BL\_L}$ to the bit line BL. When the forward bias is applied to the diode DD, the voltage generator 13 transfers the voltage $V_{WL\_L}$ to the word line WL and the voltage $V_{BL\_H}$ to the bit line BL.

If the relation of the voltages $V_{BL\_H} > WL\_H$ exists, the voltage $V_{BL\_H}$ may be transferred to the bit line BL and the voltage $V_{WL\_H}$ may be transferred to the word line WL when the forward bias is applied to the diode DD. Similarly, if the relation of the voltages $V_{BL\_L} < V_{WL\_L}$ exists, the voltage $V_{BL\_L}$ may be transferred to the bit line BL and the voltage $V_{WL\_L}$ may be transferred to the word line WL when the reverse bias is applied to the diode DD.

1-5-1. Detailed Configuration Example of the Sense Amp 12

Next, a configuration example of the sense amp 12 according to the present embodiment will be described using FIG. 7. In the present embodiment, the sense amp 12 using ΔΣ modulation is used. That is, the sense amp 12 includes n-channel type MOS transistors 12-1 to 12-3, inverters 12-4 to 12-6, a p-channel type MOS transistor 12-7, a counter 12-8, a capacitor element 12-9, and a constant current source 12-10. The constant current source 12-10 includes a p-channel type MOS transistor 12-10-1 and a current source 12-10-2.

A voltage VDD or the like is supplied to one end (drain end) of a current path of the MOS transistor 12-1 and the gate of the MOS transistor 12-1 and the gate of the p-channel type MOS transistor 12-10-1 constituting a current mirror of the MOS transistor 12-1 are commonly connected. That is, the MOS transistor 12-1 passes the same current (drain current) as the constant current source 12-10 does.

One end (drain end) of the current path of the MOS transistor 12-2 is commonly connected to the other end (source end) of the current path of the MOS transistor 12-1, the other end thereof is connected to a node N1, and a signal Feedback is supplied to the gate thereof. When the signal Feedback is at an "H" level and the MOS transistor 12-2 is turned on, the MOS transistor 12-2 supplies a current Ibl to the node N1 as the drain current. The node N1 is connected to the memory cell MC via the bit line BL.

One electrode of the capacitor element 12-9 is connected to the node N1 and the other electrode is set to a ground potential. The capacitor element 12-9 accumulates a charge corresponding to the potential of the bit line BL. That is, the capacitor element 12-9 functions as an integrator. The capacity of the capacitor element 12-9 is set as Cct.

The potential of the node N1 is input into an input terminal of the inverter 12-4 and an output terminal thereof is connected to one end (drain end) of the current path of the MOS transistor 12-3. The other end (source end) of the current path of the MOS transistor 12-4 is connected to the input terminal of the inverter 12-5 and a signal CLK that controls ON/OFF of the MOS transistor 12-3 is supplied to the gate thereof. That is, the MOS transistor 12-3 functions as a switch element that connects the output terminal of the inverter 12-4 and the input terminal of the inverter 12-5.

One end (drain end) of the current path of the MOS transistor 12-7 is connected to the output terminal of the inverter 12-5. The other end (source end) of the current path of the MOS transistor 12-7 is connected to the input terminal of the inverter 12-6 and a signal/CLK that controls ON/OFF of the MOS transistor 12-7 is supplied to the gate thereof. That is, the MOS transistor 12-7 functions as a switch element that connects the output terminal of the inverter 12-5 and the input terminal of the inverter 12-6.

The output terminal of the inverter 12-6 is connected to a node N2. The potential of the node N2 is supplied to the gate of the MOS transistor 12-2 and the counter 12-8.

The counter 12-8 counts the number of times the signal Feedback output from the node N2 is at the "H" level and outputs an operation result in accordance with the count value to the data buffer 15 as read data.

2. Operation of the Sense Amp 12

Next, a read operation of the sense amp 12 in the above configuration will be described. The sense amp 12 senses the current Icell flowing to the bit line BL to read data held by the memory cell MC to be read. Here, the description focuses on the bit line BL and the word line WL connected to one of the memory cells MC to be read.

First, the voltage $V_{WL\_L}$ is transferred to the connected select word line WL and the voltage $V_{BL\_H}(>V_{WL\_L})$ to the select bit line BL so that a forward bias is applied to the memory cell MC to be read when data is sensed.

2-1. When "1" Data is Held by the Memory Cell MC

When the resistance value of the variable resistive element VR is small (the low-resistance state in FIG. 4 and the memory cell MC holds "1" data), the current Icell_1 (see FIG. 5) flows to the memory cell MC. Thus, the potential of the node N1 falls. Accordingly, when the potential of the node N1 falls below a threshold voltage of the inverter 12-4, the inverter 12-4 outputs the "H" level. At this point, the MOS transistor 12-3 is turned off.

Next, when the signal CLK is turned on, the potential ("H" level) output by the inverter 12-4 is transferred to the inverter 12-5. As a result, the inverter 12-5 outputs the "L" level. At this point, the MOS transistor 12-7 is turned off.

Next, when the signal/CLK is turned on, the output potential ("L" level) of the inverter 12-5 is transferred to the input terminal of the inverter 12-6 by the MOS transistor 12-7. As a result, the inverter 12-6 outputs the "H" level to the node N2.

The potential ("H" level) of the node N2 is transferred to the gate of the MOS transistor 12-2 as the signal Feedback. As a result, the MOS transistor 12-2 is turned on. That is, the MOS transistor 12-2 transfers the current Ibl transferred from the constant current source 12-10 to the node N1.

As described above, the current Icell_1 flows from the bit line BL to the word line WL and the potential of the bit line BL falls. The current Ibl supplied from the constant current source 12-10 flows to raise the potential of the node N1 (bit line BL). The current flowing into the node N1 is set as a current Ibl_1 and if Icell<Ibl, the potential of the bit line BL starts to rise and then reaches an initial potential.

If, as a result, the potential (node N1) of the bit line BL exceeds the threshold voltage of the inverter 12-4, the inverter 12-4 outputs the "L" level. Thus, the potential of the node N2 is set to the "L" level in accordance with the signals CLK, /CLK and the MOS transistor 12-2 is turned off. That is, the potential of the bit line BL (node N1) falls and the node N2 (signal Feedback) is set to the "H" level in accordance with the potential of the bit line (node N1) again. The potential of the node N2 repeats the "H" level and the "L" level within a fixed time t (sense time $T_{sense}$ described later). The number of times the "H" level is set within the fixed time t is set as M1 and the counter 12-8 counts the number of times the potential of the node N2 (signal Feedback) is set to the "H" level within the fixed time t. If the number of times M1 that the "H" level is set within the fixed time t (sense time $T_{sense}$) exceeds a predetermined default value, the counter 12-8 determines that the memory cell MC holds "1" data.

2-2. When "0" Data is Held by the Memory Cell MC

In this case, the resistance value of the variable resistive element VR of the memory cell MC is, as described above, 100 kΩ to 1 MΩ in the high-resistance state and thus, if the same voltage is applied to the memory cells, the current Icell_0 smaller than the current Icell_1 flows to the memory cell MC. That is, as described above, the potential of the bit line BL (node N1) is less likely to be at the "L" level than it is when the memory cell MC holds "0" data. Thus, the time for a transition of the potential of the node N1 from the "H" level to the "L" level to occur within the fixed time t becomes longer than that in the above case. That is, the MOS transistor 12-2 is not turned on until the potential of the node N1 is set to the "L" level and thus, the value of the current Ibl flowing into the node N1 (the amount of current flowing into the node N1 in unit time t) becomes smaller. That is, the current Ibl supplied by the MOS transistor 12-2 to the node N1 becomes smaller than the current Ibl_1. The current in this case is set as Ibl_0. Also in this case, as described above, the potential of the node N2 repeats the "H" level and the "L" level within the fixed time t. Here, the number of times the "H" level is set within the fixed time t is set as M0.

Also in this case, like above case, the counter 12-8 counts the number of times M0 the potential of the node N2 is set to the "H" level within the fixed time t. If the number of times M0 the "H" level is set within the fixed time t is smaller than the predetermined default value, the counter 12-8 determines that the memory cell MC holds "0" data. If the number of times M0 and the number of times M1 are not distinguished, the number of times is simply called a number of times M.

3. Detailed Configuration of the Counter 12-8

Next, a detailed configuration of the counter 12-8 will be described using FIG. 8. As shown in FIG. 8, the counter 12-8 includes a NAND circuit 20, an inverter 21, a p-channel type MOS transistor 22, n-channel type MOS transistors 23, 24, a capacitor element 25, and a voltage sensing circuit 26.

As shown in FIG. 8, the NAND circuit 20 performs a NAND operation of the signal Feedback output from the node N2 and the signal CLK and supplies a result thereof to the inverter 21.

The inverter 21 inverts the operation result and supplies the inverted result to the gate of the MOS transistor 23 as a signal FBCLK.

A signal PCbias is supplied to the gate of the MOS transistor 22 and, for example, the voltage VDD is supplied to one end of the current path thereof. The source current output from the other end of the MOS transistor 22 is set as a current $I_{cr}$. The MOS transistor 22 constitutes a mirror circuit with a transistor (not shown) functioning as a constant current source. The transistor (not shown) also constitutes a mirror circuit with the MOS transistor 22 in the other sense amp 12. That is, the current $I_{ct}$ also flows to the other sense amp 12 by the signal PCbias when data is read.

One end of the current path of the MOS transistor 23 is connected to the other end of the current path of the MOS transistor 22 and the other end thereof is connected to one electrode of the capacitor element 25 via a node N10. That is, the MOS transistor 23 functions as a switch element that supplies the current $I_{ct}$ supplied from the MOS transistor 22 to the node N10 when turned on by the signal FBCLK.

The capacitor element 25 accumulates a charge Q in accordance with a period t during which the current $T_{ct}$ is supplied. The capacity of the capacitor element 25 is set as $C_{ct}$. The value of $C_{ct}$ will be calculated below.

First, a charge $Q_{count}$ injected into the node N10 in a sense period $T_{sense}$ will be determined. When the number of times of the clock CLK that the "H" level is set in the sense period $T_{sense}$ is N, the number of times the signal Feedback is set to the "H" level is M, and a duty cycle (a time ratio of the "H" level and the "L" level is 1:1) of the clock CLK is 50%, the charge $Q_{count}$ is represented by Formula (1) shown below:

$$Q_{count} = I_{ct} \cdot \frac{M}{N} \cdot \frac{T_{sense}}{2} \quad (1)$$

Thus, a voltage $V_{count}$ in the node N10 is represented by Formula (2) shown below:

$$V_{count} = \frac{Q_{count}}{C_{ct}} = \frac{I_{ct} \cdot M \cdot T_{sense}}{2N \cdot C_{ct}} \quad (2)$$

From Formula (2), the value of the capacitor element is represented by Formula (3) shown below:

$$C_{ct} = \frac{Q_{count}}{V_{count}} = \frac{I_{ct} \cdot M \cdot T_{sense}}{2N \cdot V_{count}} \quad (3)$$

Thus, the capacity $C_{ct}$ is set in such a way that the voltage $V_{count}$ exceeds the threshold voltage of the MOS transistor 26-3 when the arbitrary number of times M reaches a default value (for example, when the above number of times M1 reaches the default value). That is, the number of times M1 exceeding the default value is a condition for determining that the memory cell MC holds "1" data.

Further, the number of times M1 for the case when the default value is exceeded is a number of times resulting from holding data of the memory cell MC when the signal Feedback outputs a pulse wave this number of times during the $T_{sense}$ period because the current Icell_1 flows to the memory cell MC.

One end of the current path of the MOS transistor 24 is connected to the node N10, the other end thereof is grounded, and a signal bCT_enb is supplied to the gate thereof. The MOS transistor 24 functions as a reset transistor to initialize the potential of the node N10. More specifically, the potential of the node N10 is set to a ground potential by turning on the MOS transistor 24 before the operation to read data is started.

Next, the voltage sensing circuit 26 will be described. The voltage sensing circuit 26 includes an inverter 26-1 and an inverter 26-2. The node N10 is connected to the input terminal of the inverter 26-1 and the output terminal thereof is connected to the input terminal of the inverter 26-2. A signal Read data at the "H" level or "L" level is output from the output terminal of the inverter 26-2. More specifically, if the voltage in accordance with the charge accumulated in the capacitor element 25 is higher than the threshold of the inverter 26-1, output of the inverter 26-1 is set to the "L" level (0 V) and the inverter 26-2 outputs the "H" level ("1" data) as read data (signal Read data).

On the other hand, if the voltage of the capacitor element 25 is lower than the threshold of the inverter 26-1, that is, equal to or less than the threshold of the inverter 26-1, the inverter 26-1 outputs the "H" level and, as a result, the inverter 26-2 outputs the "L" level ("0" data) as read data (signal Read data).

<Read Operation>

Next, the read operation of the sense amp 12 will be described using FIG. 9. FIG. 9 is a flow chart showing the read operation of the sense amp 12. A control signal supplied to the sense amp 12 is generated by the controller 14.

First, when the read operation is started (step S1), the signal bCT_enb is set to the "H" level, and the MOS transistor 24 is turned on. Accordingly, the node N10 is set to the ground potential and the counter 12-8 is initialized (step S2).

Next, the sense amp 12 senses the current flowing to the corresponding bit line BL (step S3). If, as a result of sensing, the amount of the current Ibl flowing into the bit line BL, that is, the voltage (the potential of the node N10) in accordance with the amount of charge accumulated in the capacitor element 25 in accordance the signal FBCLK output from the inverter 21 in the sense time $T_{sense}$ is higher than the threshold voltage of the inverter 26-1 (YES in step S4), the inverter 26-1, as a result, outputs the "L" level (0 V) (step S5) and next, data at the "H" level as a read level is read by the inverter 26-2 (step S6).

In contrast, in step S4, if the voltage (the potential of the node N10) in accordance with the amount of charge accumulated in the capacitor element 25 is lower than the threshold voltage of the inverter 26-1 (NO in step S4), the inverter 26-1 outputs the "H" level (step S7) and next, data at the "L" level as a read level is read by the inverter 26-2 (step S8).

<Simulation Result>

Figure 10:
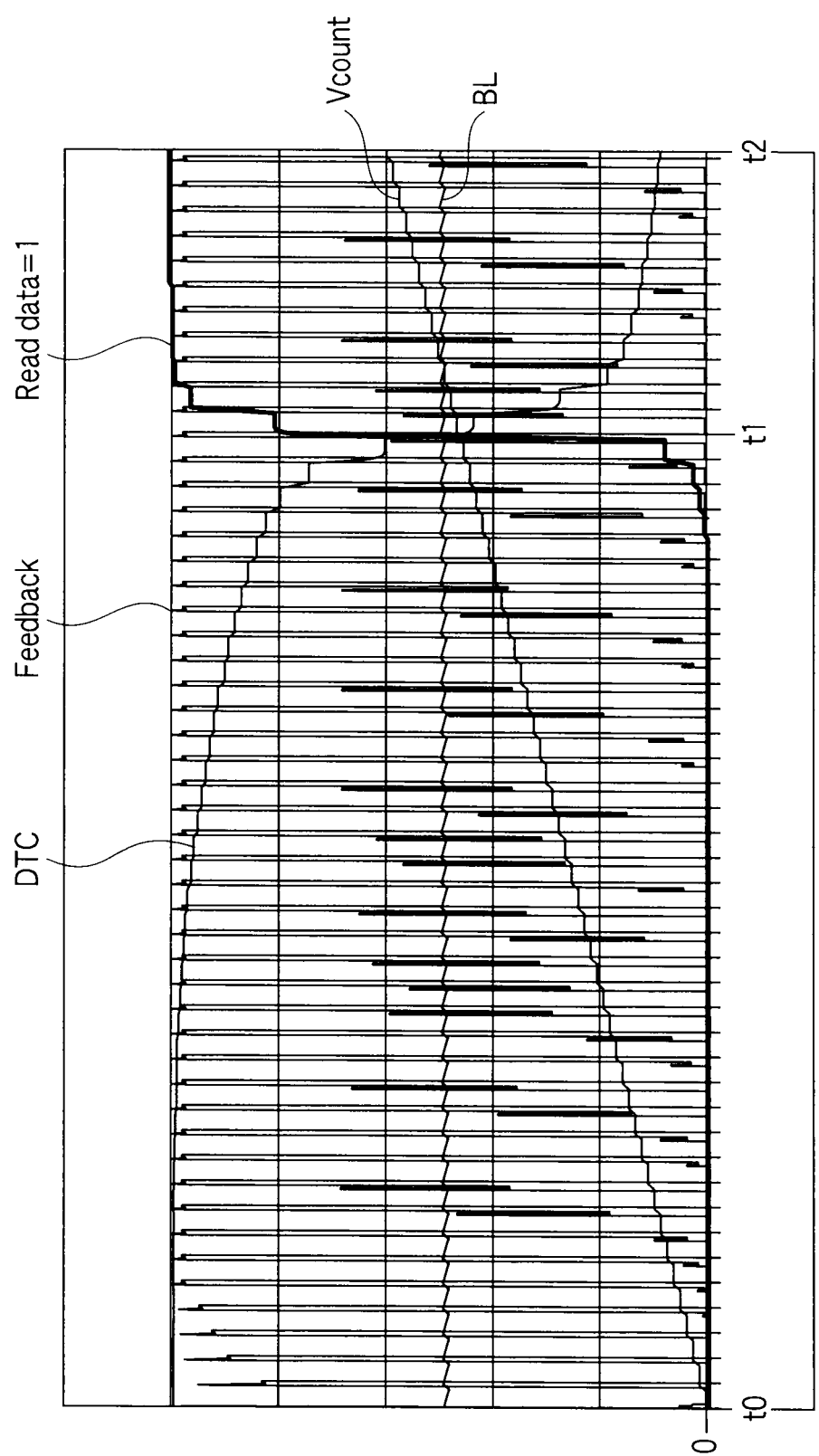
FIG. 10 is a diagram showing a simulation result of the read operation of the semiconductor storage device according to the first embodiment.

Next, a simulation result of changes in potential of each node and signal is shown using FIG. 10 when the memory cell MC holds "1" data in the sense amp 12 and the "1" data is read. In this case, the counter 12 outputs the "1" data to the data buffer 15 (Read data=1 in FIG. 10). As shown in FIG. 10, the vertical axis represents the voltage of each node and the horizontal axis represents the time. More specifically, the vertical axis shows changes of the signal Feedback, output of the inverter 26-1 (hereinafter, called the voltage DTC), the node N10 (voltage $V_{count}$), potential of the bit line BL, and output (read data) of the inverter 26-2. The period between times t0 to t2 is assumed to be the sense time $T_{sense}$.

As illustrated in FIG. 10, a waveform in which the voltage of the bit line BL after time t0 repeatedly rises and falls with the upper limit set by the threshold of the inverter 12-4 is obtained. This is because a voltage drop (discharge) by the current Icell_1 flowing to the bit line BL and a charge of the node N10 (bit line BL) by the MOS transistor 12-2 through the current Ibl described above are alternated. That is, the potential of the bit line BL rises up to the threshold voltage of the inverter 12-4 at the same time as the signal Feedback changes to the "H" level and when the signal Feedback changes to the "L" level, the potential of the bit line BL is discharged to fall to a certain voltage.

The voltage $V_{count}$ of the node N10 rises due to the current Ict supplied from the MOS transistor 22 in accordance with the signal Feedback set to the "L" or "H" level. As the voltage $V_{count}$ approaches the threshold of the inverter 26-1, the potential of the voltage DTC falls. If the voltage $V_{count}$ of the node N10 exceeds the threshold voltage of the inverter 26-1 at time t1, the voltage DTC output by the inverter 26-1 changes to the "L" level and, as a result, the inverter 26-2 outputs the "H" level, that is, "1" data is output as the signal Read data.

According to a semiconductor storage device in the present embodiment, the circuit area may be reduced. In the past, a circuit (counter circuit) provided in a sense amp using ΔΣmodulation to determine whether sensed data is "0" data or "1" data is a digital counter. The digital counter is constituted of, for example, a T-flipflop using a JK-flipflop. If the digital counter is an 8-bit counter, eight T-flip-flops are needed. One such T-flipflop needs 38 transistors and so a total of 304 transistors are needed for the 8-bit digital counter. That is, an occupation area of circuits increases and, as a result, the chip area increases.

According to a semiconductor storage device in the present embodiment, by contrast, a sense amp performing ΔΣmodulation is provided with an analog counter. That is, as shown in FIG. 8, the counter 12, which has the same amp as the sense amp 12 according to the present embodiment, is constituted of seven transistors. In other words, the chip area may be reduced.

Further, according to a semiconductor storage device in the present embodiment, for example, if data is read from all bit lines BL at the same time, noise between adjacent bit lines BL may be reduced. That is, operations such as erroneous reading of data may be improved. Even if the amplitude of the bit line BL fluctuates when data is sensed, the sense amp 12 according to the present embodiment may grasp holding data of the memory cell MC to be read by using the current Ibl flowing to the bit line BL via the node N1 in the $T_{sense}$ period. This is because discharging and charging are alternated in the $T_{sense}$ period as represented by Formula (1) and the potential of the bit line BL may be averaged by using values of the number of times M of the signal Feedback set to the "L" or "H" level in accordance with the changing potential of the node N1, the sense period $T_{sense}$, the number of times N of the clock CLK, and the current Ibl value. Thus, even if the potential of the bit line BL fluctuates with a certain amplitude, data may be read accurately while noise of the bit lines BL is reduced. That is, the need for shielding of the bit lines BL may be eliminated.

Moreover, as described above, data may be read from all bit lines BL at the same time and so the reading time may be shortened. That is, data is generally read separately from two respective bit lines BL adjacent to each other so that noise is not caused by a current flowing to the adjacent bit line BL or a voltage of the adjacent bit line BL. Sets of two adjacent bit lines BL include a set of the bit line BL0 and the bit line BL1, a set of the bit line BL2 and the bit line BL3, a set of the bit line BL4 and the bit line BL5, and so forth. That is, n/2 bit lines BL of the n bit lines BL are read in one operation.

According to the present embodiment, by contrast, as described above, data may be read from all bit lines BL and so the reading time may be reduced by a factor of 2. That is, being able to read data from all bit lines BL means that select bit lines BL may be adjacent to each other, which eliminates the need for address allocation. That is, the controller 14 may be simplified.

Further, if the sense amp is a sense amp for voltage sensing or current sensing, the current flowing to the bit line BL is sensed by the voltage in accordance with data transferred by the row decoder and read to the word line WL. That is, if the memory cell MC holds, for example, multi-level data, more specifically, 4-level data, two or three read operations may be needed depending on the reading method.

According to the present embodiment, by contrast, as described above, the voltage transferred to the word line WL is a fixed value and the current flowing to the bit line BL is sensed by the fixed voltage. That is, holding data may be sensed by one read operation. This enables further shortening of the reading time.

Second Embodiment

Next, a semiconductor storage device according to the second embodiment will be described using FIGS. 11 and 12. The semiconductor storage device according to the present embodiment has a configuration in which the counter 12-8 includes a charge pump. The same reference numerals are used for the same structural elements as those in the first embodiment. Overlapping descriptions are omitted.

1. Detailed Configuration of the Counter 12-8

A configuration example of the counter 12-8 according to the present embodiment will be described using FIG. 11. As shown in FIG. 11, the counter 12-8 newly includes, instead of the MOS transistor 22 in the first embodiment, capacitor elements 30, 32 and MOS transistors 31, 33. A charge pump is formed by the capacitor elements 30, 32 and the MOS transistors 31, 33.

Figure 11:
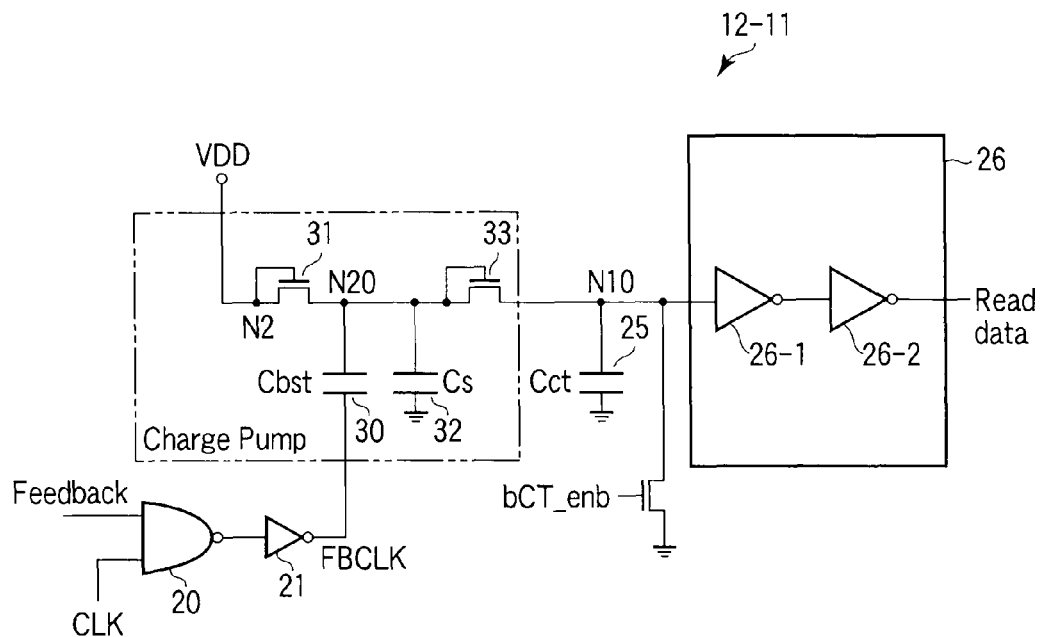
FIG. 11 is a block diagram exemplifying the sense amp according to a second embodiment.

As shown in FIG. 11, for example, the voltage VDD is supplied to one end (drain side) of the current path of the MOS transistor 31, a node N20 is connected to the other end (source side), and the gate thereof is commonly connected to the one end of the current path. That is, the MOS transistor 31 is drain-connected and the potential of the node N20 rises to a voltage obtained by subtracting the threshold voltage of the MOS transistor 31. In other words, if the threshold voltage of the MOS transistor 31 is $Vth_{31}$, the voltage of the node N20 rises to $(VDD-Vth_{31})$ as the initial potential.

The wire capacity inside the illustrated charge pump is set as Cs. When Cs=0, the potential of the node N20 rises to the above voltage.

One end (drain side) of the LOS transistor 33 is connected to the node N20, the other end (source side) is connected to the node N10, and the gate thereof is commonly connected to the drain end. That is, the MOS transistor 33 is also drain-connected and the potential of the node N10 rises to a voltage obtained by subtracting the threshold voltage of the MOS transistor 33 from the potential of the node N20. If the threshold voltage of the MOS transistor 33 is $Vth_{33}$, the potential of the node N10 rises to the voltage $(VDD-Vth_{31}-Vth_{33})$ as the initial potential. One electrode of the capacitor element 25 is connected to the node N10 and the other electrode is grounded.

Further, a signal FBCLK is supplied to one electrode of the capacitor element 30 and the other electrode is connected to the node N20. The amplitude of the signal FBCLK is set, for example, as a voltage VCC. Thus, the potential difference between both electrodes of the capacitor element 30 is set to, for example, the voltage VCC by the signal FBCLK. The capacity of the capacitor element 30 is set as Cbst. That is, if the signal FBCLK provided to the capacitor element 30 is changed from 0 V to the voltage VCC, the potential of the node N20 rises from the voltage $(VDD-Vth_{31})$ to the voltage $(VDD-Vth_{31}+VCC)$. Accordingly, the voltage VCC is transferred to the node N10 via the MOS transistor 33. That is, at this point, the potential of the node N10 rises from the voltage $(VDD-Vth_{31}-Vth_{33})$ to the voltage $(VDD+VCC-Vth_{31}-Vth_{33})$. In the configuration of the analog counter 12-8, the value of the capacity $C_{ct}$ of the capacitor element 25 will be determined below. That is, when the memory cell MC holds "1" data, the capacity $C_{ct}$ such that the potential of the voltage $V_{count}$ of the node N10 is equal to or greater than the threshold voltage of the MOS transistor 26-3 is determined. The capacity $C_{ct}$ may be represented by Formulas (4) to (9) below according to known calculations.

In this configuration, the capacity $C_{ct}$ of the capacitor element 25 is represented by Formula (4) below:

$$C_{ct} = K \cdot (C_{bst} + C_s) \quad (4)$$

The potential $V_{count}$ of the node N1 is represented by Formula (5) below using the number of times M the "H" level is set in a fixed time t:

$$V_{count}(M) = VDD - Vth31 - Vth33 + \left[1 - \left(\frac{K}{1+K}\right)^M\right] \cdot (1 - \varepsilon_1)VCC \quad (5)$$

where a relationship among α, K, and M is represented by Formula (6) below:

$$\alpha = 1 - \left(\frac{K}{1+K}\right)^M \quad (6)$$

If the number of times M is infinite and an increase of $V_{count}$ is considered, the above Formula (5) may be represented by Formula (7) below:

$$\Delta V_{count}(\infty) = (1 - \varepsilon_1)VCC \quad (7)$$

From the above Formula (6), the above Formula (5) is represented by Formula (8) below:

$$\alpha = \frac{V_{count}(M) - V_{count}(0)}{\Delta V_{count}(\infty)} \quad (8)$$

Further, from the above Formula (6), K is represented by Formula (9) below:

$$K = \frac{-1}{\ln(1-\alpha)} M - 0.5 \quad (9)$$

If the value of K is given, $C_{ct}$ is determined by the above Formula (4).

Thus, when the arbitrary number of times M (the number of times M is, for example, the number of times M1 exceeding a default value) is reached, the capacity $C_{ct}$ is determined so that the voltage $V_{count}$ exceeds the threshold voltage of the MOS transistor 26-3.

2. Read Operation

Next, the operation when data is read in the configuration of FIG. 11 described above will be described.

First, when the read operation is started, the signal bCT_enb is set to the "H" level and the node N10 is grounded by the controller 14. Thus, the charge accumulated in the capacitor element $C_{ct}$ flows out to the ground via the node N10 and the MOS transistor 24. That is, the capacitor element $C_{ct}$ is initialized.

Next, when the signal Feedback is supplied to the NAND circuit 20 by the counter 12 described in FIG. 7 and synchronized with the clock CLK, the voltage (amplitude VCC) at the "H" level is supplied to the capacitor element 30 as the signal FBCLK. Thus, the potential of the node N20 reaches the sum of the voltage (VDD–Vth$_{31}$) supplied from the MOS transistor 31 and the voltage VCC.

Next, the MOS transistor 33 transfers the charge on the node N20 to the node N10. Then, when the signal FBCLK is set to the "L" level, the potential of the node N20 is set to the voltage (VDD–Vth$_{31}$–VCC), but is raised to the voltage (VDD–Vth$_{31}$) by the MOS transistor 31. Thereafter, the charge on the node N20 is transferred to the node N10 by the signal FBCLK being set to the "H" level again.

As a result, if the value of the voltage $V_{count}$ in accordance with the charge accumulated by the capacitor element 25 is larger than the threshold voltage of the MOS transistor 26-3, the read data is set as "1" data (the holding data of the memory cell MC is "1" data). On the other hand, if the value of the voltage $V_{count}$ is smaller than the threshold voltage of the MOS transistor 26-3, the read data is set as "0" data (the holding data of the memory cell MC is "0" data).

3. Simulation Results

Figure 12:
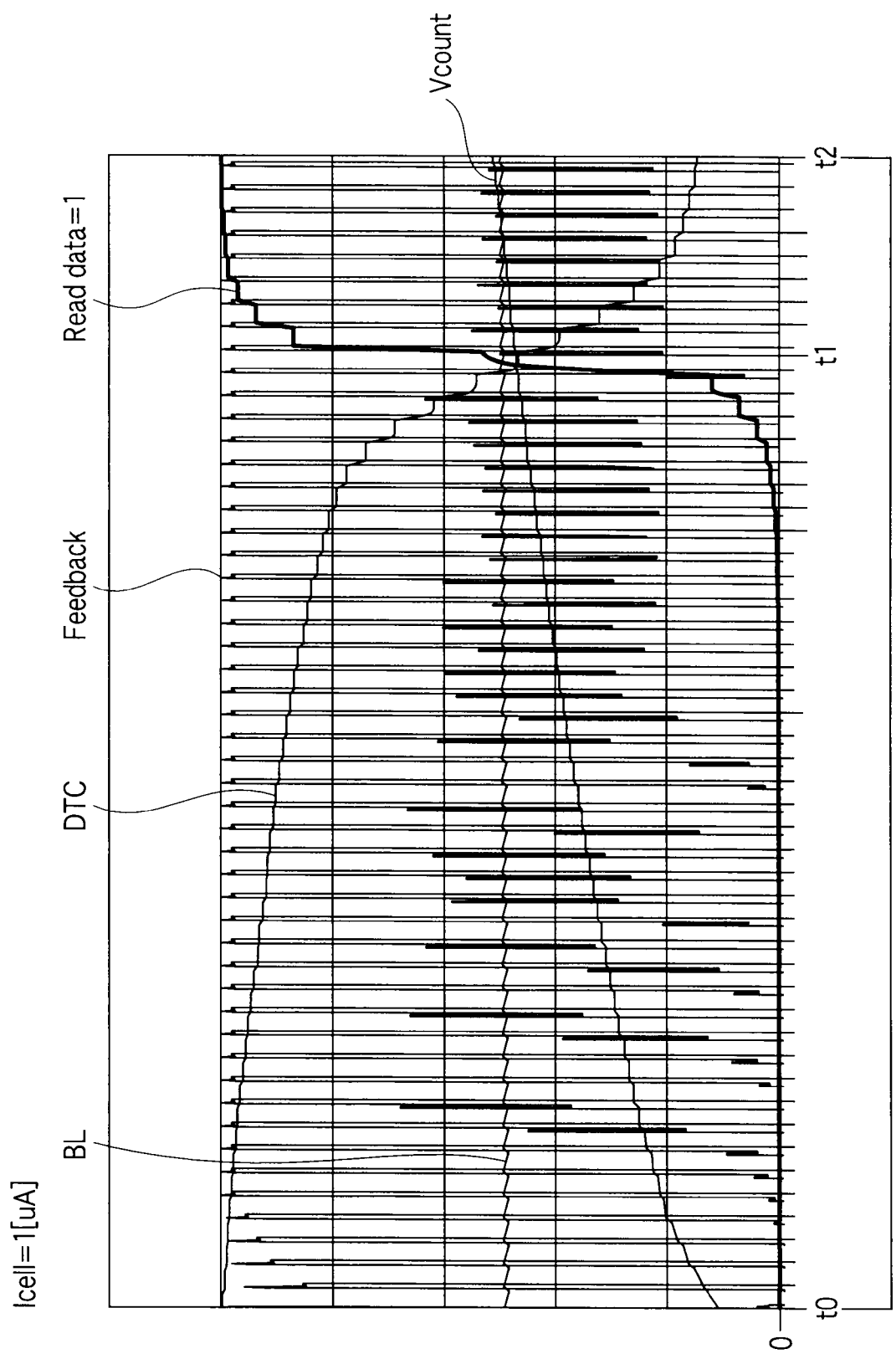
FIG. 12 is a diagram showing a simulation result of the read operation of the semiconductor storage device according to the second embodiment.

Next, a simulation diagram of changes in potential of each node and signal is shown using FIG. 12 when the memory cell MC holds "1" data in the sense amp 12 and the "1" data is read. As a result of reading, the counter 12 outputs the "1" data to the data buffer 15 (Read data=1 in FIG. 12).

As shown in FIG. 12, the vertical axis represents the voltage of each node and the horizontal axis represents the time. More specifically, the vertical axis represents the signal Feedback, output of the inverter 26-1 (denoted as the voltage DTC in FIG. 12), potential (voltage $V_{count}$) of the node N10, potential of the bit line BL, and output (read data) of the inverter 26-2. The same operations as those in FIG. 10 according to the first embodiment will not be described.

After time t0, the signal FBCLK at the "H" level (voltage VCC) is output from the inverter 21 to the capacitor element 30 depending on the state (one of the "H" level state and the "L" level state) of the signal Feedback and synchronization with the signal CLK. Thus, the above voltage is supplied from the charge pump to the node N10. Accordingly, the voltage $V_{count}$ of the node N10 rises and rises close to the threshold voltage of the inverter 26-1 at time t1. Next, when the voltage $V_{count}$ exceeds the threshold of the inverter 26-1 with a rising voltage of the node N10, the output (voltage DTC) of the inverter 26-1 is inverted to cause a transition from the "L" level to the "H" level. Thus, the inverter 26-2 outputs read data "1" at the "L" level.

A semiconductor storage device according to the present embodiment may achieve further effects, in addition to effects in the first embodiment. That is, like the first embodiment, the counter 12-8 provided in a sense amp according to the present embodiment is an analog counter and thus, the area may be reduced. In the present embodiment, the counter 12-8 includes a charge pump. The charge pump is formed of, as described above, the MOS transistors 31, 33 and the capacitor elements 30, 32. Also in this case, it is sufficient to have only the MOS transistors 31, 33 and the capacitor elements 30, 32 and it is possible to have the area smaller than a digital counter.

Further, according to a semiconductor storage device in the present embodiment, noise between adjacent bit lines BL may be reduced. That is, operations such as erroneous reading of data may be improved.

Further, in addition to the first embodiment, the reading time of data may be reduced. That is, according to the counter 12-8 according to the first embodiment, the wire capacity up to the transfer of a predetermined voltage to the gate of the MOS transistor 22 and the gate capacity of the MOS transistor 22 increase. In other words, the MOS transistor 22 provided for each sense amp 12 forms a mutually common constant current source and current mirror (not shown). To be more precise, the wire capacity increases as the number of the sense amps 12 increases and it takes time before the current Ict output by the MOS transistor 22 provided in each sense amp 12 flows.

According to the present embodiment, by contrast, the potential of the node N10 is raised by using a charge pump and therefore, the above problems may be solved.

Third Embodiment

Next, a semiconductor storage device according to the third embodiment will be described using FIG. 13. The semiconductor storage device according to the present embodiment includes a configuration in which the sense amp 12 is associated with multi-level bits. That is, even when the memory cell MC holds one of states corresponding to "00", "01", "10", and "11", the sense amp 12 according to the present embodiment may sense holding data of the memory cell MC by sensing the current Icell flowing to the memory cell MC in accordance with the resistance value. In other words, the voltage sensing circuit 26 is configured to read information of one of four values by sensing the potential of the node N10 accumulated in accordance with the number of times M of the signal Feedback resulting from a magnitude of the current Icell flowing to the bit line BL. It is assumed that the memory cell MC holds data of "00", "01", "10", and "11" in ascending order of resistance value of the variable resistive element VR. A detailed configuration of the counter 12-8 according to the present embodiment will be described later.

1. Configuration of the Counter 12-8

The counter 12-8 according to the present embodiment is configured, as described above, by changing the voltage sensing circuit 26 from 2-level compatible to 4-level data detectable. More specifically, the voltage sensing circuit 26 includes inverters 40 to 50, 63 to 67 and NAND circuits 60 to 62. Which data of "four" values is held by the memory cell MC is determined in descending order of threshold voltage of signals Read_0 to Read_3. The memory cell MC is recognized to hold "11" when, for example, a signal Read_0="H" and recognized to hold "00" when a signal Read_3="H". Hereinafter, descriptions of the same structural elements as those in FIG. 8 are omitted.

Figure 13:
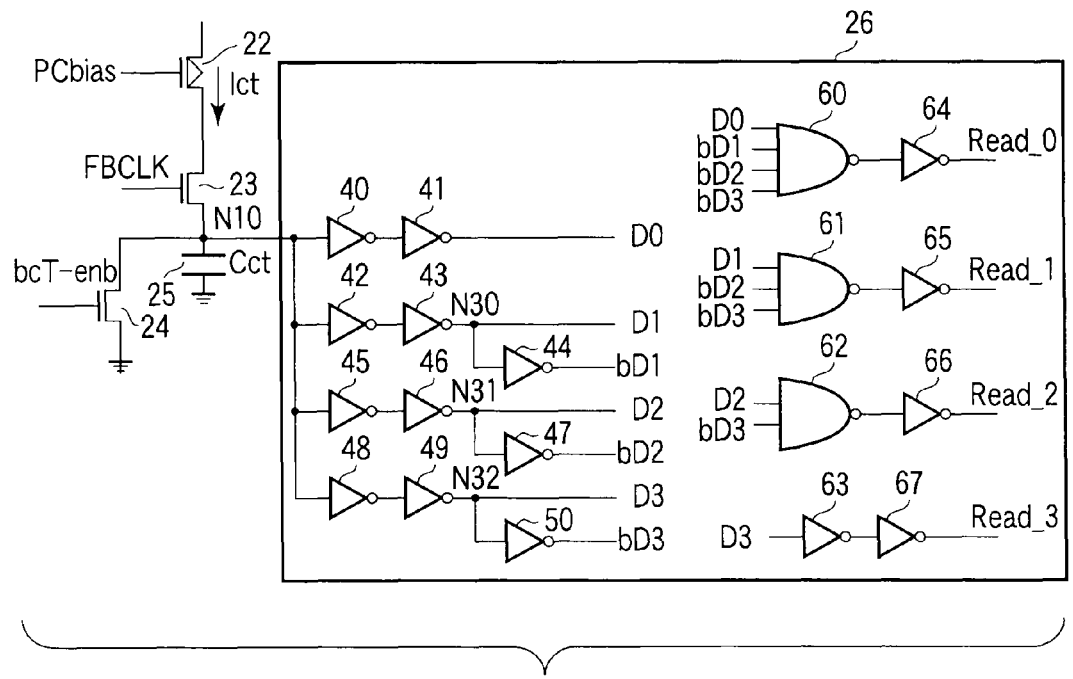
FIG. 13 is a block diagram exemplifying the sense amp according to a third embodiment.

As shown in FIG. 13, the inverter 40 inverts the voltage of the node N10 and transfers the inverted voltage to the inverter 41. Next, the inverter 41 further inverts the voltage output from the inverter 40 and outputs the inverted voltage as a signal D0. The threshold voltage of the inverter 40 is set as $Vth_{40}$. That is, if the voltage $V_{count}$ of the node N10 exceeds $Vth_{40}$ due to the number of times M the signal Feedback is set to the "H" level in the sense period $T_{sense}$, the inverter 40 inverts an output signal. The number of times the inverter 40 inverts an output signal is set as M11, which is smaller than any of numbers of times M10, M01, and M00 described below. This is because the "11" data among the four values has the largest resistance value of the variable resistive element VR and the small current Icell flowing to the bit line BL so that, compared with other values, the number of times M by the signal Feedback becomes smaller.

The inverter 42 inverts the voltage of the node N10 and transfers the inverted voltage to the inverter 43. Next, the inverter 43 further inverts the voltage output from the inverter 42 and outputs the inverted voltage to a node N30 as a signal D1. The inverter 44 inverts the potential of the node N30 and outputs the inverted potential as a signal bD0. The threshold voltage of the inverter 42 is set as Vth42 (>Vth40). That is, if the voltage $V_{count}$ of the node N10 exceeds Vth42 due to the number of times M the signal Feedback is set to the "H" level in the sense period Tsense, the inverter 42 inverts an output signal. The number of times the inverter 42 inverts an output signal is set as M10.

The inverter 45 inverts the voltage of the node N10 and transfers the inverted voltage to the inverter 46. Next, the inverter 46 further inverts the voltage output from the inverter 45 and outputs the inverted voltage to a node N31 as a signal D2. The inverter 47 inverts the potential of the node N31 and outputs the inverted potential as a signal bD2. The threshold voltage of the inverter 45 is set as $Vth_{45}$ ($>Vth_{42}$). That is, if the voltage $V_{count}$ of the node N10 exceeds $Vth_{45}$ due to the number of times M the signal Feedback is set to the "H" level in the sense period $T_{sense}$, the inverter 45 inverts an output signal. The number of times the inverter 45 inverts an output signal is set as M01.

The inverter 48 inverts the voltage of the node N10 and transfers the inverted voltage to the inverter 49. Next, the inverter 49 further inverts the voltage output from the inverter 48 and outputs the inverted voltage to a node N32 as a signal D3. The inverter 50 inverts the potential of the node N32 and outputs the inverted potential as a signal bD3. The threshold voltage of the inverter 48 is set as $Vth_{48}$ ($>Vth_{45}$). That is, if the voltage $V_{count}$ of the node N10 exceeds $Vth_{48}$ due to the number of times M the signal Feedback is set to the "H" level in the sense period $T_{sense}$, the inverter 48 inverts an output signal. The number of times the inverter 48 inverts an output signal is set as M00.

The NAND circuit 60 performs a NAND operation of the signals D0, bD1, bD2, and bD3 and outputs an operation result thereof to the inverter 64. Next, the inverter 64 inverts the operation result supplied from the NAND circuit 60 and outputs the inverted result as the signal Read_0. As described above, when the memory cell MC holds "11" data, the signal Read_0 is set to the "H" level.

The NAND circuit 61 performs a NAND operation of the signals D1, bD2, and bD3 and outputs an operation result thereof to the inverter 65. Next, the inverter 65 inverts the operation result supplied from the NAND circuit 61 and outputs the inverted result as the signal Read_1. When the memory cell MC holds "10" data, the signal Read_1 is set to the "H" level.

The NAND circuit 62 performs a NAND operation of the signals D2 and bD3 and outputs an operation result thereof to the inverter 66. Next, the inverter 66 inverts the operation result supplied from the NAND circuit 62 and outputs the inverted result as the signal Read_2. When the memory cell MC holds "01" data, the signal Read_2 is set to the "H" level.

The inverter 63 inverts the signal D3 and outputs the result to the inverter 67. The inverter 67 outputs the inverted voltage supplied from the inverter 63 as the signal Read_3. As described above, when the memory cell MC holds "00" data, the signal Read_3 is set to the "H" level.

Thus, the signals Read_0 to Read_3 are each set to the "H" level or the "L" level in accordance with data held by the memory cell MC and the controller 14 thereby recognizes holding data of the memory cell MC.

<Data Reading Operation>

Next, a case when the memory cell MC holds, for example, "00" in the counter 12-8 of FIG. 13 will be described as an example. In this case, the number of times M by the signal Feedback is set to M00 or more and the voltage $V_{count}$ has a value equal to or greater than the threshold $Vth_{48}$. Thus, the signal D3 is set to the "H" level and the signal bD3 is set to the "L" level and therefore, the signals Read_0 to Read_2 are each set to the "L" level and the signal Read_3 is set to the "H" level. The read operation will be described below.

When the read operation by the sense amp 12 performing ΔΣmodulation is started, the signal Feedback is output to the counter 12-8 in accordance with the current flowing to the bit line BL. Thus, the voltage $V_{count}$ of the node N10 is raised by the ON/OFF operation of the MOS transistor 23 in accordance with the signal FBCLK. As a result, when the voltage $V_{count}$ of the node N10 becomes a value equal to or larger than the threshold $Vth_{48}$, the inverter 48 outputs the "L" level. Next, the inverter 49 in the subsequent stage outputs the signal D3 set to the "H" level.

If the signal D3 is set to the "H" level, the signal bD3 naturally outputs the "L" level. As a result, each of the NAND circuits 60 to 62 using the signal bD3 as one of signals to be operated outputs the "H" level. That is, the signals Read_0 to Read_2 are each set to the "L" level. As a result, the sense amp 12 recognizes that the memory cell MC to be read contains "00".

If the memory cell MC holds "11", the value of the voltage $V_{count}$ of the node N10 is larger than the threshold Vth40 and smaller than the threshold Vth42. Thus, the signal D0 is set to the "H" level, the signals D1 to D3 are set to the "L" level, and the signals bD1 to bD3 are set to the "H" level. As a result, only the signal Read_0 is set to the "H" level. In this case, the sense amp 12 detects the signal Read_0 and thereby determines that the memory cell MC holds "11".

According to a semiconductor storage device in the present embodiment, if the memory cell MC holds, for example, 4-level data, data may be sensed without extending the circuit configuration. That is, according to a sense amp using a conventional digital counter, two T-flipflops are needed for 4-level (2-bit) data and so 76 MOS transistors are needed.

According to the present embodiment, by contrast, it is sufficient to have only the 11 inverters 40 to 50, that is, 22 MOS transistors. In other words, the area may be smaller when compared with conventional ones. Moreover, when the number of bits of holding data of the memory cell MC is increased, it is enough to increase inverters constituting the voltage sensing circuit 26 by the number thereof associated with the number of bits.

Fourth Embodiment

Next, a semiconductor storage device according to the fourth embodiment will be described using FIG. 14. The semiconductor storage device according to the present embodiment has a configuration in which the signal D0 supplied to the NAND circuit 60 of the counter 12-8 is excluded and instead, the voltage VDD is newly input.
<Configuration of the Counter 12-8>

Figure 14:
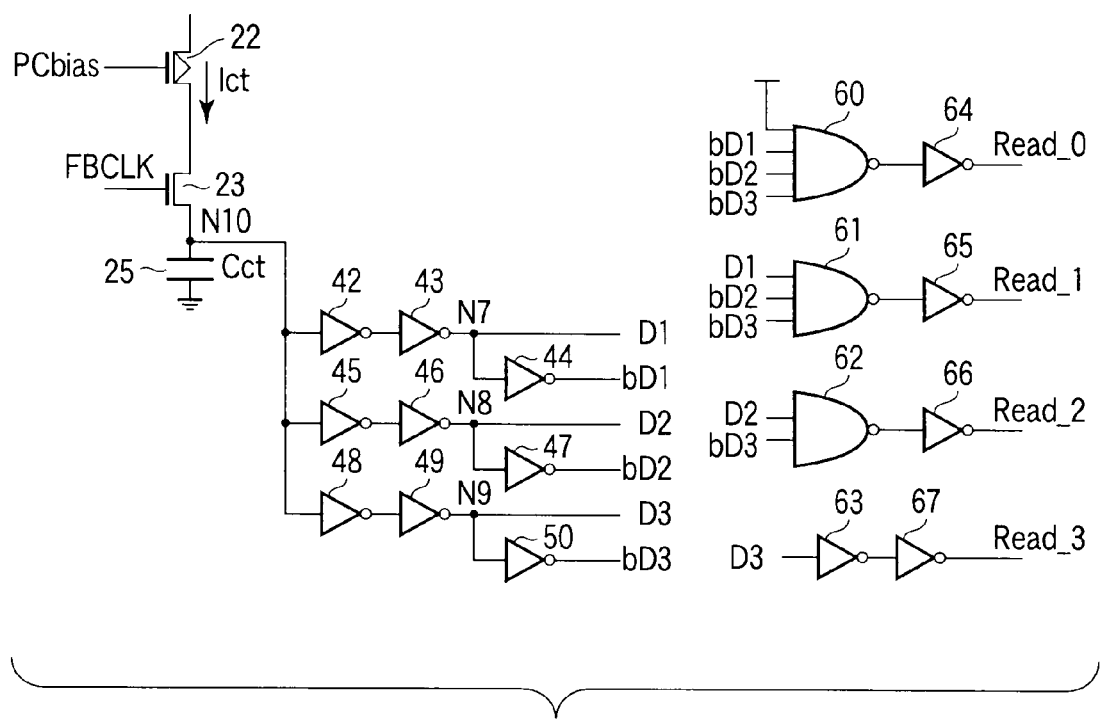
FIG. 14 is a block diagram exemplifying the sense amp according to a fourth embodiment.

As shown in FIG. 14, one signal that may be input into the NAND circuit 60 is set as a fixed voltage. Accordingly, the counter 12-8 according to the present embodiment has a configuration in which the inverters 40, 41 that output the signal D0 are excluded. The configuration is the same as that in the third embodiment and descriptions thereof are omitted.
<Simulation Result>

Next, a simulation result when data is sensed by the counter 12-8 of the configuration in FIG. 14 is explained using FIGS. 15A to 15E. The same operations as those in the first and second embodiments will not be described.

Figure 15A:
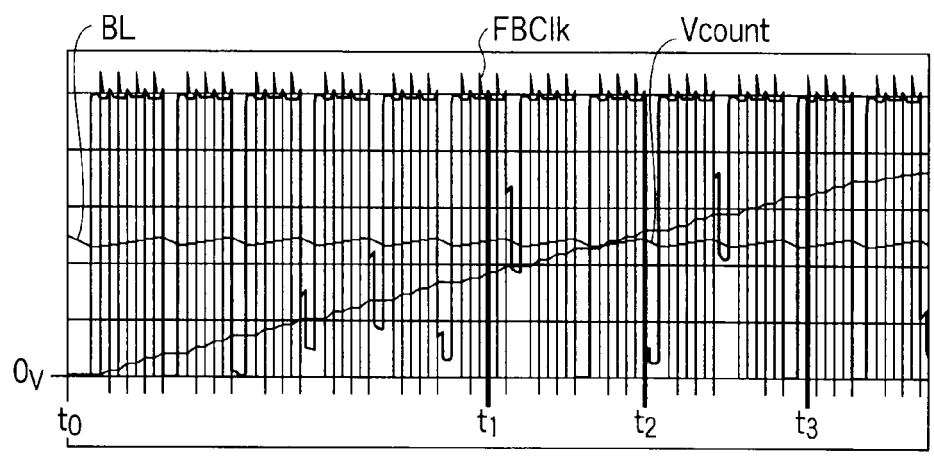
FIGS. 15A, 15B, 15C, 15D, and 15E are diagrams showing simulation results of the read operation of the semiconductor storage device according to the fourth embodiment.
Figure 15B:
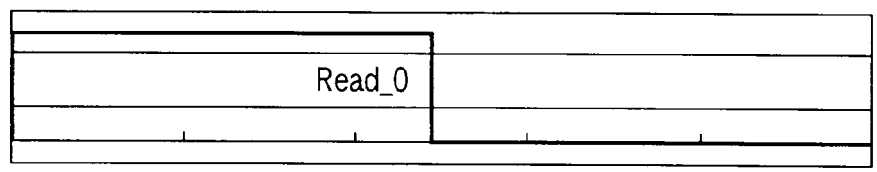
Figure 15C:
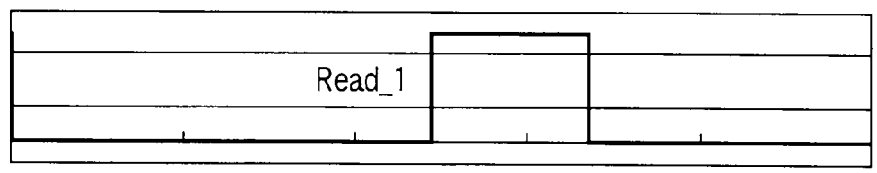
Figure 15D:
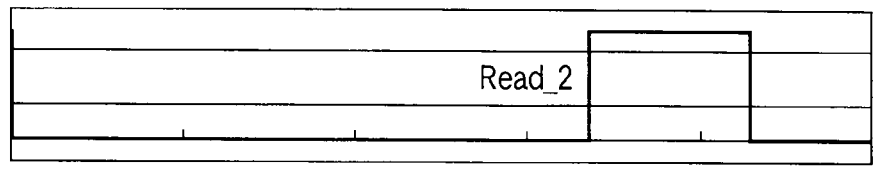
Figure 15E:
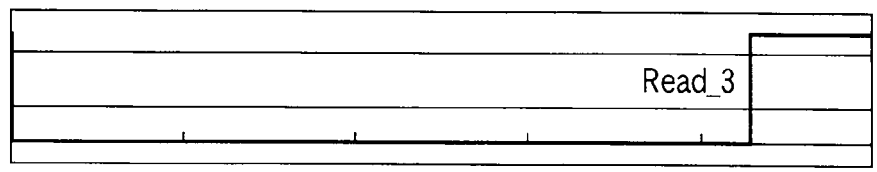

A simulation diagram of changes in potential of each node and signal is shown when the memory cell MC holds "00" data in the sense amp 12 and the "00" data is read. In this case, as described above, the signal Read_3 is set to the "H" level. As shown in FIGS. 15A to 15E, the vertical axis represents the voltage of each node and the horizontal axis represents the time. More specifically, the vertical axis represents changes of the potentials of the signal Feedback, the node N10 (voltage $V_{count}$), the bit line BL, and the signals Read_0 to Read_3 (read data) in FIG. 15A. FIG. 15B focuses on the signal Read_0 of FIG. 15A, FIG. 15C focuses on the signal Read_1 of FIG. 15A, FIG. 15D focuses on the signal Read_2 of FIG. 15A, and FIG. 15E focuses on the signal Read_3 of FIG. 15A. The same operations as those in FIGS. 10 and 12 according to the first embodiment will not be described.

After time t0, the potential $V_{count}$ of the node N10 rises due to a pulse wave by the signal Feedback. The potential of the node N10 does not exceed the threshold of the inverters 42, 45, and 48 at time t0 and thus, the NAND circuit 60 outputs the signal Read_0 at the "H" level as a result of the NAND operation of the voltage VDD ("H" level) and the signals bD1 to bD3 ("L" level).

Then, at time t1, when the voltage $V_{count}$ reaches the voltage $Vth_{42}$, the signal D1 is switched from the "L" level to the "H" level and thus, the signal Read_0 is switched to the "L" level and the signal Read_1 is switched to the "H" level.

Next, at time t2, when the voltage $V_{count}$ reaches the voltage $Vth_{45}$, the signal D2 is switched from the "L" level to the "H" level and thus, the signal Read_0 and the signal Read_1 are switched to the "L" level and the signal Read_2 is switched to the "H" level.

Further, at time t3, when the voltage $V_{count}$ reaches the voltage $Vth_{48}$, the signal D3 is switched from the "L" level to the "H" level and thus, the signals Read_0 to Read_2 are switched to the "L" level and the signal Read_3 is switched to the "H" level.

A semiconductor storage device according to the present embodiment may further realize the reduction of the circuit area of the counter 12-8, in addition to effects achieved in the third embodiment. That is, according to the counter 12-8 in the present embodiment, the inverters 40, 41 that output the signal D0 are no longer used but, instead of the signal D0, an internal voltage (for example, the voltage VDD) is input into the NAND circuit 60.

Therefore, according to the present embodiment, four MOS transistors may further be reduced for one sense amp 12. As described above, data is read from all bit lines at the same time and thus, sense amps 12 as many as the number of the bit lines BL are provided. That is, if the number of the bit lines BL is, for example, 2,048 ($2 \times 2^{10}$), the number of the sense amps 12 provided is 2,048 and the corresponding number of MOS transistors may be reduced.

Fifth Embodiment

Next, a semiconductor storage device according to the fifth embodiment will be described using FIG. 16. In the present embodiment, a case when the sense amp 12 performing ΔΣmodulation of the potential of the above bit line is applied to a NAND type flash memory.
<Overall Configuration Example>

An overall configuration of the NAND type flash memory will be described using FIG. 16. The same functions as those in FIG. 1 will not be described.
<Detailed Configuration of the Memory Cell Array 10>

Figure 16:
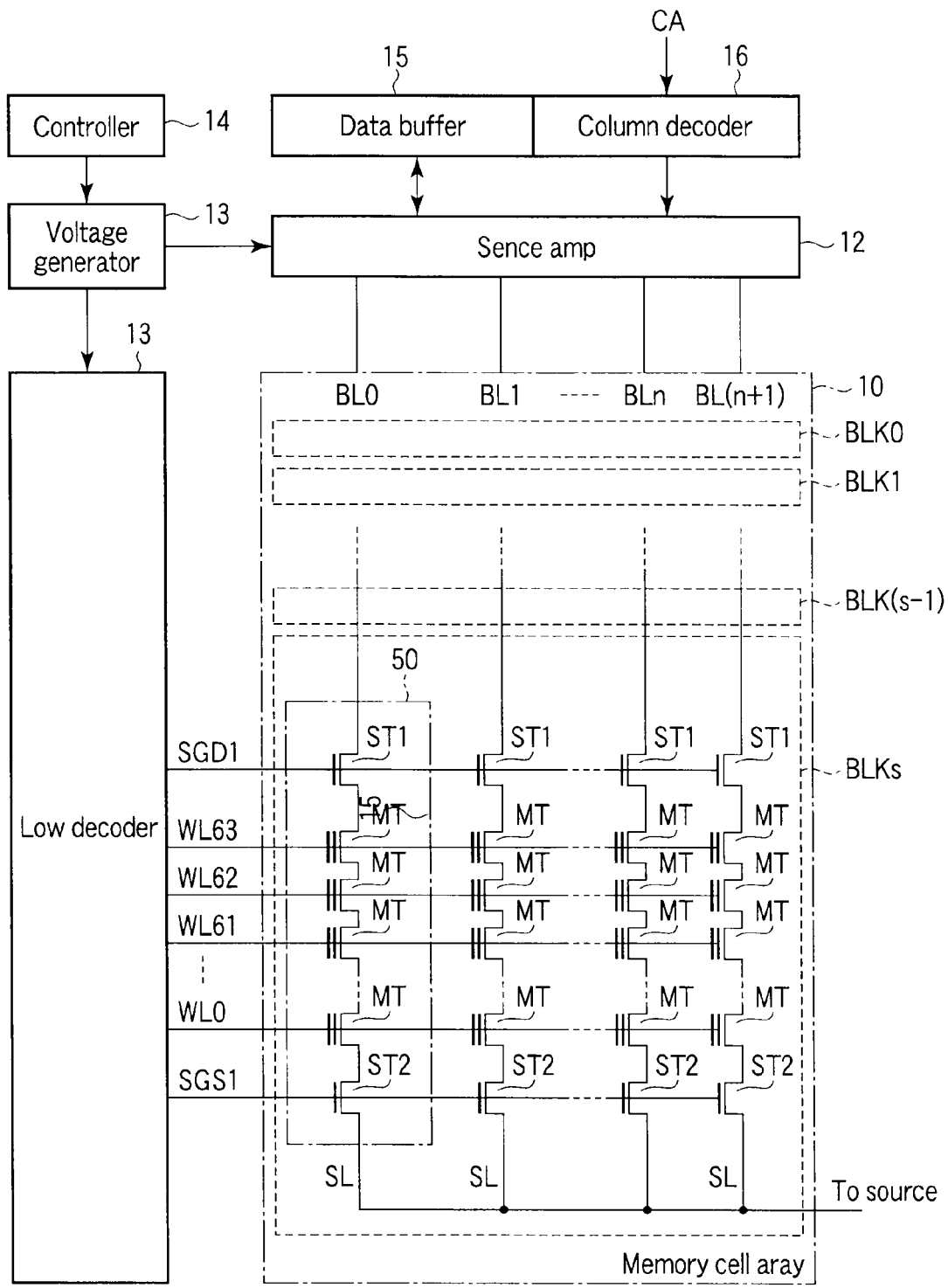
FIG. 16 is an overall block diagram of a NAND type flash memory according to a fifth embodiment.

As shown in FIG. 16, the memory cell array 10 includes a plurality of nonvolatile memory cell transistors MT capable of holding, for example, 2-level or higher-level data. The memory cell transistor MT is an n-channel MOS transistor including, for example, a stacked gate containing a charge accumulation layer and a control gate. The control gate of the memory cell transistor MT functions as a word line, the drain thereof is electrically connected to a bit line, and the source thereof is electrically connected to a source line. The memory cell array 10 includes the blocks BLK0 to BLKs (s is a natural number) containing the plurality of nonvolatile memory cell transistors MT.

As illustrated in FIG. 16, each of the blocks BLK0 to BLKs includes a plurality of NAND strings 50 in which current paths of the nonvolatile memory cell transistors MT are connected in series. Each of the NAND strings 50 contains, for example, 64 memory cell transistors MT and select transistors ST1, ST2. The memory cell transistor MT has an FG structure having a charge accumulation layer (floating gate: conductive layer) formed on a semiconductor substrate via a gate dielectric film, an inter-layer dielectric formed on the floating gate, and a control gate electrode formed further on the inter-layer dielectric layer. Incidentally, the memory cell transistor MT may have a MONOS structure. The MONOS structure has a charge accumulation layer (for example, a dielectric film) formed on a semiconductor substrate via a gate dielectric film, a dielectric film (hereinafter, called a block layer) formed on the charge accumulation layer and having a higher dielectric constant than the dielectric constant of the charge accumulation layer, and a control gate electrode formed further on the block layer. The number of the memory cell transistors MT is not limited to 64 and may be 128, 256, 512 or the like and is not limited. Moreover, adjacent memory cell transistors MT share the source and drain with each other. The memory cell transistors MT are arranged between the select transistors ST1, ST2 in such a way that current paths thereof are connected in series. A drain region on one side of the memory cell transistors MT connected in series is connected to a source region of the select transistor ST1 and the source region on the other side is connected to the drain region of the select transistor ST2.

Control gate electrodes of the memory cell transistors MT in the same row are commonly connected to one of the word lines WL0 to WL63 and gate electrodes of the select transistors ST1, ST2 of the memory cell transistors MT in the same row are commonly connected to select gate lines SGD1, SGS1, respectively. For the sake of simplifying the following descriptions, when the word lines WL0 to WL63 are not distinguished, the word line may simply be called the word line WL. Drains of the select transistors ST1 in the same column in the memory cell array 10 are commonly connected to one of the bit lines BL0 to BLn. Hereinafter, when the bit lines BL0 to BLn are not distinguished, the block is collectively called the bit line BL (n: natural number). Sources of the select transistors ST2 are commonly connected to a source line SL. When the blocks BLK0 to BLKs are not distinguished, the block is collectively called the block BLK.

Data is collectively written into the plurality of memory cell transistors MT connected to the same word line WL and this unit is called a page. Further, data is collectively erased in blocks BLK from the plurality of NAND strings 50.

<Threshold Distribution of the Memory Cell Transistor MT>

Figure 17:
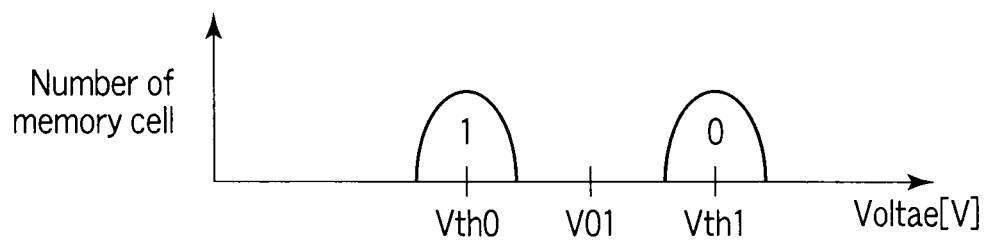
FIG. 17 is a conceptual diagram showing a threshold distribution of the memory cell according to the fifth embodiment.

Next, the threshold distribution of the memory cell transistor MT will be described using FIG. 17. FIG. 17 is a graph in which the horizontal axis represents the number of the memory cell transistors MT and the vertical axis represents the number of the memory cell transistors MT.

As illustrated in FIG. 17, each of the memory cell transistors MT may hold, for example, 2-level data (1-bit data). That is, the memory cell transistor MT may hold two kinds of data, "1" (erasing level) and "0" (program) in ascending order of threshold voltage Vth.

The threshold voltage Vth0 of "1" data (erasing level) in the memory cell transistor MT has a relationship Vth0<V01. The threshold voltage Vth1 of "0" data has a relationship V01<Vth1. Thus, the memory cell transistor MT may hold 1-bit data of "0" data and "1" data in accordance with the threshold. The threshold voltage is fluctuated by injecting charges into the charge accumulation layer. The memory cell transistor MT may be made to be able to hold 4-level or higher-level data. In such a case, the memory cell transistor MT is made to be able to hold one piece of data of "11", "10", "01", and "00" in ascending order of threshold and when the threshold voltage of the memory cell transistor MT is at an erasing level, the memory cell transistor MT holds "11" data. Incidentally, the holding data may be "00", "01", "10", and "11" in ascending order of threshold voltage. In this case, the "00" data is regarded as an erasing state.

<Voltage Generator 13>

The voltage generator 13 generates a predetermined voltage when the controller 14 issues an instruction of a write operation, read operation, or verify operation of data. More specifically, the voltage generator 13 generates a voltage VPGM, voltage VPASS, voltage VCGR, or voltage VREAD.

The voltage VPGM refers to the voltage of a magnitude to the extent that a charge of a channel in the memory cell transistor MT is injected into the charge accumulation layer and a transition of the threshold of the memory cell transistor MT to another level is caused.

The voltage VPASS is a voltage at which the memory cell transistor MT is turned on.

The voltage VCGR is used as a voltage in accordance with data to be read from the memory cell transistor MT or as a (write, erasing) verify voltage.

If the memory cell transistor MT is turned on by the voltage VCGR in a read operation, the threshold voltage of the memory cell transistor MT is lower than the voltage VCGR and at an erasing level. Conversely, if the memory cell transistor MT is turned off, it may be verified that the threshold voltage is in a program state (see FIG. 17).

In a verify operation, the voltage VCGR is set to a certain value. If the memory cell transistor MT is turned on by the voltage VCGR in a verify operation, the threshold voltage of the memory cell transistor MT is lower than the set verify voltage. Conversely, if the memory cell transistor MT is turned off, it may be verified that the threshold voltage is higher than the verify voltage.

In the present embodiment, it is only required to be able to grasp the current Icell flowing to the bit line BL in the sense period $T_{sense}$ and thus, the value of the voltage VCGR may be a value between the erasing level and the program state or a value equal to or more than the maximum threshold voltage that may be held by the memory cell transistor MT. To make the embodiments easier to understand, hereinafter, it is assumed that the voltage VCGR is a value larger than the threshold voltage of the memory cell transistor MT holding "1" data. If the memory cell transistor MT holds, for example, 4-level data, the voltage VCGR is assumed to be a value larger than the threshold voltage of the memory cell transistor MT holding "00" data.

The voltage VREAD is a voltage that activates the memory cell transistor MT regardless of held data. That is, for example, in FIG. 17, the voltage VREAD is a value larger than the threshold voltage of the memory cell MC holding "1" data. In other words, the voltage VREAD and the voltage VCGR may be the same voltage.

<Cell Current Icell Flowing to the Memory Cell Transistor MT>

Figure 18A:
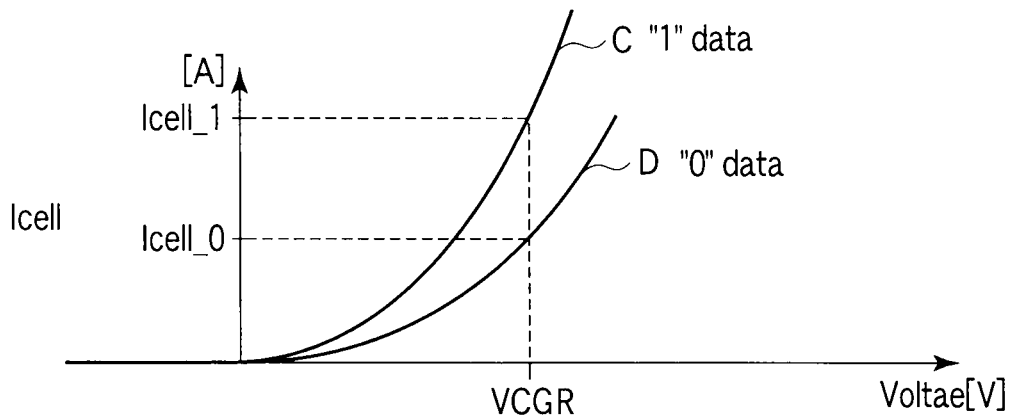
FIGS. 18A and 18B are conceptual diagrams showing the current flowing to the memory cell according to the fifth embodiment.
Figure 18B:
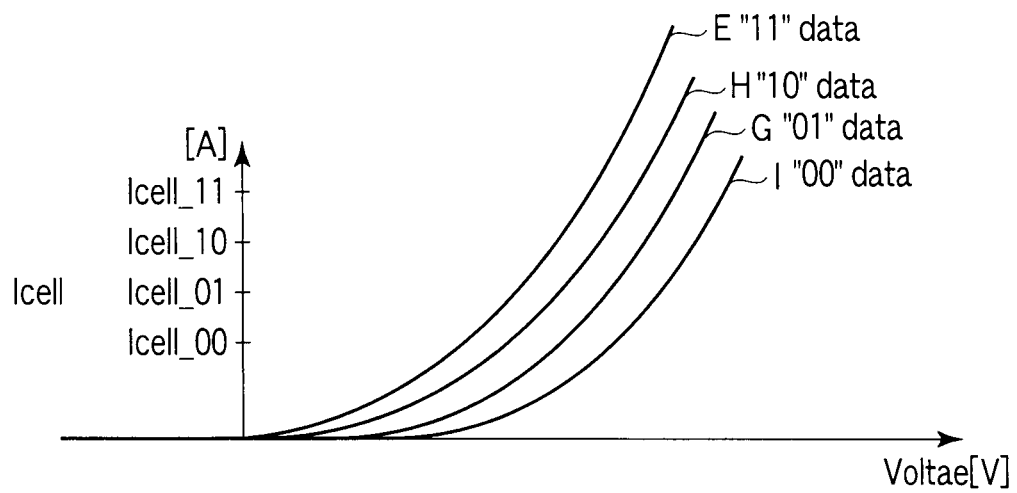

Next, the cell current Icell flowing to the memory cell transistor MT when data is read will be described using FIGS. 18A and 18B. FIG. 18A is a conceptual diagram showing current-voltage characteristics of the memory cell transistor MT resulting from 2-level data (threshold voltage) held by the memory cell transistor MT. FIG. 18B is a conceptual diagram showing current-voltage characteristics of the memory cell transistor MT resulting from 4-level data (threshold voltage) held by the memory cell transistor MT.

The vertical axis of FIGS. 18A and 18B represents the cell current (Icell) and the horizontal axis represents the reading voltage (for example, the voltage VCGR). As described above, the voltage VCGR is a voltage that activates the memory cell transistor MT into which "0" data has been written by a program operation.

If, as shown in FIG. 18A, the voltage VCGR is transferred to the memory cell transistor MT in the program state ("0" data is held), the current Icell_0 flows to the NAND string 50 (channel in the memory cell transistor MT) (D line in FIG. 18A). In contrast, if the voltage VCGR is transferred to the memory cell transistor MT in the erasing state ("1" data is held), the current Icell_1, which is larger than the current Icell_0, flows to the NAND string 50 (channel in the memory cell transistor MT) (C line in FIG. 18A).

Similarly, the cell current Icell flowing to the memory cell transistor MT will be described using FIG. 18B. If, as shown in FIG. 18B, the voltage VCGR is transferred to the memory cell transistor MT into which "00" data has been written by the program operation, a current Icell_00 flows to the NAND string 50 (channel in the memory cell transistor MT) (I line in FIG. 18B).

If the voltage VCGR is transferred to the memory cell transistor MT into which "10" data has been written by the program operation, a current Icell_10, which is larger than the current Icell_00, flows to the NAND string 50 (channel in the memory cell transistor MT) (G line in FIG. 18B).

If the voltage VCGR is transferred to the memory cell transistor MT into which "01" data has been written by the program operation, a current Icell_01, which is larger than the current Icell_10, flows to the NAND string 50 (channel in the memory cell transistor MT) (H line in FIG. 18B).

If the voltage VCGR is transferred to the memory cell transistor MT into which "11" data has been written by the program operation, a current Icell_11, which is larger than the current Icell_01, flows to the NAND string 50 (channel in the memory cell transistor MT)(E line in FIG. 18B).

<Data Reading Operation>

Next, the operation of reading data of "1" or "0" from the memory cell transistor MT will be described. As described in the first and second embodiments, the sense amp includes the counter 12-8. The operation of the sense amp 12 is the same as that of the above embodiments and so will not be described.

First, when a read command of data and an address to be read are received from a host (not illustrated), the controller 14 controls the read operation of the whole NAND type flash memory according to the command.

The controller 14 supplies a row address RA to the row decoder 11 and a column address CA to a column decoder (not illustrated). The row decoder 11 and the column decoder that have decoded the respective addresses select the memory cell transistors MT in the memory cell array 10 in the column and row directions.

The controller 14 also issues an instruction to generate the reading voltage VCGR and the voltage VREAD to the voltage generator 13.

Next, all bit lines BL are precharged by the sense amp 12 (more specifically, the MOS transistor 12-1). That is, the sense amp 12 transfers a voltage BLv (for example, a value corresponding to the threshold of the inverter 12-4) to the bit line BL and the row decoder 11 transfers the above voltage VCGR to the select word line WL and also the voltage VREAD to the non-select word lines WL. If the memory cell transistor MT to be read holds "0" data, the memory cell transistor MT to be read is namely turned on so that the NAND string 50 conducts. That is, the current Icell (Icell_0 for 2-level data) resulting from data held by the memory cell transistor MT flows toward the source line SL.

Thus, as described by using, for example, FIG. 7, the potential of the node N1 of the sense amp 12 falls and therefore, the current Ibl flows from the MOS transistors 12-1, 12-2 to the node N1 (bit line BL) to compensate for the fall.

That is, as described above, the signal Feedback repeats the "L" level and "H" level and accordingly, the voltage $V_{count}$ of the node N10 in the above counter 12-8 rises. If the voltage $V_{count}$ reaches the threshold of the inverter 26-1 or more in accordance with the number of times M the signal Feedback is set to the "H" level, "1" data is output to the data buffer 15.

When the holding data of the memory cell transistor MT is "1", by contrast, if the voltage $V_{count}$ does not exceed the threshold of the inverter 26-1, that is, the voltage $V_{count}$ is equal to or less than the threshold of the inverter 26-1, "0" data is output to the data buffer 15.

In the foregoing, a case when the memory cell transistor MT holds 2-level data has been described, and further, if the memory cell transistor MT holds 4-level data, the counter 12-8 described in the third and fourth embodiments may be used. In this case, the sense amp 12 reads the current Icell flowing to the bit line BL when the same reading voltage VCGR is transferred to the selected memory cell transistor MT to sense which of Icell_00 to Icell_11 the holding data of the memory cell transistor MT is. Next, the sense amp 12 senses the voltage $V_{count}$ of the node N10 in accordance with the current Icell_00 to Icell_11 by using the voltage sensing circuit 26 to read holding data of the memory cell transistor MT. Next, one of the signals Read_0 to Read_3 set to the "H" level is output from the voltage sensing circuit 26 to the signal data buffer 15.

More specifically, if the voltage $V_{count}$ of the node N10 in FIG. 13 is larger than the threshold $Vth_{40}$ of the inverter 40 but smaller than the threshold $Vth_{42}$ of the inverter 42, only the signal Read_0 is set to the "H" level and the other signals Read_1 to Read_3 are each set to the "L" level. In this case, the sense amp 12 reads "00" as the holding data of the memory cell transistor MT.

Similarly, if the voltage $V_{count}$ of the node N10 is larger than the threshold $Vth_{42}$ of the inverter 42 but smaller than the threshold $Vth_{45}$ of the inverter 45, only the signal Read_1 is set to the "H" level and the other signals Read_0, Read_2, and Read_3 are each set to the "L" level. In this case, the sense amp 12 reads "10" as the holding data of the memory cell transistor MT.

If the voltage $V_{count}$ of the node N10 is larger than the threshold $Vth_{45}$ of the inverter 45 but smaller than the threshold $Vth_{48}$ of the inverter 48, only the signal Read_2 is set to the "H" level and the other signals Read_0, Read_1, and Read_3 are each set to the "L" level. In this case, the sense amp 12 reads "01" as the holding data of the memory cell transistor MT.

If the voltage $V_{count}$ of the node N10 is larger than the threshold $Vth_{48}$ of the inverter 48, only the signal Read_3 is set to the "H" level and the other signals Read_0 to Read_2 are each set to the "L" level. In this case, the sense amp 12 reads "11" as the holding data of the memory cell transistor MT.

A semiconductor storage device according to the present embodiment may achieve effects similar to those of the first to fourth embodiments. According to the sense amp 12 performing ΔΣmodulation in the present embodiment, as described above, noise between adjacent bit lines BL may be reduced even if data is read from all bit lines BL at the same time. This is because, as described in the first embodiment, discharging and charging are alternated in the $T_{sense}$ period as represented by Formula (1) and the potential of the bit line BL may be averaged by using values of the number of times M of the signal Feedback set to the "L" or "H" level in accordance with the changing potential of the node N1, the sense period $T_{sense}$, the number of times N of the clock CLK, and the current Ibl. Thus, even if the potential of the bit line BL fluctuates with a certain amplitude, data may be read correctly while noise of the bit lines BL is reduced.

Sixth Embodiment

Next, a semiconductor storage device according to the sixth embodiment will be described. The semiconductor storage device according to the present embodiment is configured by replacing inverters constituting the voltage sensing circuit 26 of the counter 12-8 shown in FIG. 8 with operational amps. In this case, a reference voltage (voltage Vref) in accordance with the sensing level of the numbers of times M11, M10, M01, M00 may be supplied to, for example, an inverted input terminal. The positive input terminal of the operational amp is connected to the node N10 shown in FIG. 8.

A semiconductor storage device according to the present embodiment may, in addition to the above effects, further restrain power consumption. A semiconductor storage device according to the present embodiment is configured, as described above, by being provided with operational amps in place of inverters. Thus, a through current flowing into the sense amp 12 when data is read may be prevented.

An inverter is formed of a p-channel type MOS transistor and an n-channel type MOS transistor. Gates of the p-channel type MOS transistor and the n-channel type MOS transistor are commonly connected and the drain terminal of the p-channel type MOS transistor and the source terminal of the n-channel type MOS transistor are commonly connected. The commonly connected portion of the drain and source is an output terminal.

When the inverter outputs "0", the n-channel type MOS transistor is turned on and the output terminal is grounded. Then, a source current flows from the p-channel type MOS transistor to maintain the potential of the output terminal at a constant potential. The source current directly flows to the ground via the re-channel type MOS transistor. That is, a through current flows. The inverter has an operation point in places where a large amount of through currents flow and the period in which the through current flows is very long. That is, an increase in power consumption is caused. This is evident from the length of the period in which a transition of the voltage DTC in FIGS. 10 and 12 from the "H" level to the "L" level takes place that an operation point when a through current flows is long.

According to the present embodiment, however, operational amps are used and therefore, the through current may be prevented and power consumption may be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
first memory cells capable of holding 2-level or higher-level data;
first bit lines and first word lines capable of selecting the first memory cells and, formed in places where the first memory cells are provided by being crossed; and
first sense amps detecting a first current flowing to the first bit line in accordance with the data held by the first memory cell,
wherein the first sense amp includes a first supply unit supplying a second current to the first bit line to compensate for the falling first current flowing to the first bit line when the data is read;
a first accumulation unit accumulating an amount of charge in accordance with a potential of the first bit line;
a detector detecting the potential in accordance with the amount of charge of the first accumulation unit; and
a counter counting output from the detector;
the counter includes a second supply unit charging a first node in accordance with the second current supplied to the first bit line;
a second accumulation unit accumulating a charge in accordance with the potential of the first node; and
a sensing unit detecting the amount of charge of the second accumulation unit to detect the data held by the first memory cell based on the amount of the charge.

2. The device according to claim 1,
wherein the first current includes a third current and a fourth current larger than the third current, in case where the fourth current flows to the first bit line, the number of times the second current is supplied to the first bit line per unit time increases and the first node is set to a first voltage, and in case where the third current flows to the first bit line, the number of times the second current is supplied to the first bit line per the unit time decreases and the first node is set to a second voltage, which is lower than the first voltage.

3. The device according to claim 1,
wherein the second supply unit includes a current source supplying a fifth current to the first node and a switch element turning on or off a supply of the fifth current to the first node in accordance with the number of times,
wherein the fifth current is supplied to the first node during a period in which the second current flows to the first bit line.

4. The device according to claim 2,
wherein the second supply unit includes a charge pump supplying the first voltage or the second voltage to the first node and the first voltage or the second voltage is supplied to the first node during a period in which the second current flows to the first bit line.

5. The device according to claim 1, further comprising:
n memory cells (n: natural number equal to 1 or greater) capable of holding 2-level or higher-level data;
n bit lines and the first word lines each of which is capable of selecting the n memory cells, and which is formed in places where the n memory cells are provided by being crossed, the n bit lines being adjacent to each other in a state containing the first bit lines; and
n sense amps detecting a third current flowing to the n corresponding bit lines in accordance with the data held by the n memory cells respectively,
wherein the first bit lines and the n bit lines are selected by the first sense amps and the n sense amps at the same time and the data held by the first memory cells and the n memory cells is read.

6. The device according to claim 5, wherein the n has a value of 2.

7. The device according to claim 2,
wherein in case where the number of times is large, a capacity of the accumulation unit is set so that the amount of the charge accumulated by the accumulation unit corresponds to the first voltage,
the sensing unit includes a first inverter and a second inverter,
the first inverter outputs a ground potential to the second inverter when the first node is at the first voltage, and
the first inverter outputs an internal voltage to the second inverter when the first node is at the second voltage.

8. The device according to claim 1,
wherein when the memory cells may hold a threshold distribution of a first to n-th states (n: 4 or greater) as the data, the first node is set to one of a first to n-th voltages in accordance with the threshold distribution, the first node is set to the first voltage in the first state, the first node is set to the n-th voltage in the n-th state, and the first voltage is the highest and the n-th voltage is the lowest; and
the sensing unit has an input terminal commonly connected to the first node and includes first to t-th inverters having mutually different threshold voltages, the inverters output a signal of one of an "H" level and an "L" level as a first operation result in accordance with the threshold distribution held by the memory cell, and each of the inverters outputs, in addition to the first operation result, a second operation result obtained by inverting the first operation result.

9. A semiconductor storage device comprising:
a memory cell array in which memory cells capable of holding data are arranged along columns and rows; and
sense amps reading data by accumulating a potential of a bit line connected to the memory cell and quantizing the accumulated potential when the data is read, the sense amp charging the bit line based on a signal obtained by accumulating and quantizing the potential of the bit line,
wherein the sense amp includes a supply unit supplying a voltage in accordance with the number of times of charging per unit time to a first node;
an accumulation unit accumulating the voltage supplied to the first node; and
a sensing circuit outputting the signal of one of the "H" and "L" levels in accordance with the voltage accumulated by the accumulation unit.

10. The device according to claim 9,
wherein when the data is read, one of a first current corresponding to the held data and a second current, which is smaller than the first current, flows into the memory cell,
in case where the first current flows to the bit line, the number of times increases and the first node is charged with a first voltage, and
in case where the second current flows to the bit line, the number of times decreases and the first node is charged with a second voltage, which is smaller than the first voltage.

11. The device according to claim 9,
wherein the supply unit includes a current source supplying a third current to the first node and a switch element turning on or off a supply of the third current to the first node in accordance with the number of times,
wherein the third current is supplied to the first node during a period in which the bit line is charged.

12. The device according to claim 10,
wherein the supply unit includes a charge pump that supplying the first voltage or the second voltage to the first node and the first voltage or the second voltage is supplied to the first node during a period in which the first bit line is charged.

13. The device according to claim 9,
wherein when the memory cell is in an erasing state, the accumulation unit is set to a first voltage as a result of holding a first amount of charge and when the memory cell is in a program state, the accumulation unit is set to a second voltage, which is lower than the first voltage, as a result of holding a second amount of charge, which is smaller than the first amount of charge.

14. The device according to claim 10,
wherein when the number of times is large, a capacity of the accumulation unit is set so that an amount of charge accumulated by the accumulation unit corresponds to the first voltage, the sensing circuit includes a first inverter and a second inverter, the first inverter outputs a ground potential to the second inverter when the first node is at the first voltage, and the first inverter outputs an internal voltage to the second inverter when the first node is at the second voltage.

15. The device according to claim 9, further comprising:
a voltage generator generating a first voltage, a second voltage, and a third voltage, the second voltage being higher than the first voltage,
wherein in case where the memory cell includes a variable resistive element and a diode, the second voltage is transferred to the word line and the first voltage is transferred to the bit line so that a forward bias is applied to the diode, and in case where the memory cell includes a charge accumulation layer and a control gate, the third voltage that is higher than a maximum threshold voltage that may be taken by the memory cell is transferred to the word line.

16. The device according to claim 9,
wherein when the memory cells may hold a threshold distribution of a first to n-th states (n: 4 or greater) as the data, the first node is set to one of first to n-th voltages in accordance with the threshold distribution, the first node is set to the first voltage in the first state, the first node is set to the n-th voltage in the n-th state, and the first voltage is the highest and the n-th voltage is the lowest; and the sensing unit has an input terminal commonly connected to the first node and includes first to t-th inverters having mutually different threshold voltages, the inverters output a signal of one of an "H" level and an "L" level as a first operation result in accordance with the threshold distribution held by the memory cell, and each of the inverters outputs, in addition to the first operation result, a second operation result obtained by inverting the first operation result.

17. The device according to claim 16, if n=t, the sensing circuit further comprising:
first to n-th arithmetic circuits that output a third operation result based on the first and second operation results output by each of the inverters, wherein one of the n arithmetic circuits outputs the "H" level as the third operation result,
wherein the m-th (1≤m≤n) arithmetic circuit performs a logical operation of the first operation result by the m-th inverter and the second operation result by the (m+1)-th to n-th arithmetic circuits,
wherein if m=(n+1), the m-th arithmetic circuit performs the logical operation of the first operation result by the m-th inverter and the n-th inverter, and if m=n, the m-th arithmetic circuit performs an operation of the first operation result by the m-th inverter.

18. The device according to claim 17, if n=t+1, the sensing circuit further comprising:

the first to n-th arithmetic circuits outputting the third operation result based on the first and second operation results output by each of the inverters, wherein one of the n arithmetic circuits outputs the "H" level as the third operation result, wherein the first inverter performs the logical operation of an internal voltage and the second operation result by the (m+1)-th to n-th arithmetic circuits, the m-th (2≤m≤n) arithmetic circuit performs the logical operation of the first operation result by the m-th inverter and the second operation result by the (m+1)-th to n-th arithmetic circuits, wherein if m=(n+1), the m-th arithmetic circuit performs the logical operation of the first operation result by the m-th inverter and the n-th inverter, and if m=n, the m-th arithmetic circuit performs the operation of the first operation result by the m-th inverter.

19. The device according to claim 9, further comprising:

n memory cells (n: natural number of 1 to m, m: natural number equal to 1 or greater) capable of holding 2-level or higher-level data;

n bit lines and first word lines each of which is capable of selecting the n memory cells and which are formed in places where the n memory cells are provided by being crossed and adjacent to each other in a state containing the first bit lines; and n sense amps detecting a third current flowing to the n corresponding bit lines in accordance with the data held by the n memory cells respectively, wherein the first bit lines and the n bit lines are selected by the first sense amps and the n sense amps at the same time and the data held by the first memory cells and the n memory cells is read.

20. The device according to claim 19, wherein the n has a value of 2.

* * * * *